United States Patent
Dennison

(10) Patent No.: US 6,312,984 B1
(45) Date of Patent: *Nov. 6, 2001

(54) SEMICONDUCTOR PROCESSING METHOD OF FORMING A CONTACT PEDESTAL OF FORMING A STORAGE NODE OF A CAPACITOR AND INTEGRATED CIRCUITRY

(75) Inventor: Charles H. Dennison, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/584,156

(22) Filed: May 30, 2000

Related U.S. Application Data

(63) Continuation of application No. 08/622,591, filed on Mar. 26, 1996, now Pat. No. 6,083,831.

(51) Int. Cl.⁷ ............................................... H01L 21/8242
(52) U.S. Cl. ......................... 438/253; 438/629; 438/672
(58) Field of Search ................................... 438/253–256, 438/393–399, 629, 672

(56) References Cited

U.S. PATENT DOCUMENTS

| | | | |
|---|---|---|---|
| 4,855,801 | 8/1989 | Kuesters | 357/23.6 |
| 4,898,841 | 2/1990 | Ho | 357/68 |

(List continued on next page.)

FOREIGN PATENT DOCUMENTS

| | | |
|---|---|---|
| 0 540 930 | 5/1993 | (EP). |
| 0 696 052 | 2/1996 | (EP). |
| 62-232821 | 10/1987 | (JP). |
| 62-286270 | 12/1987 | (JP). |
| 63-133565 | 6/1988 | (JP). |
| 1-100960 | 4/1989 | (JP). |
| 1-215060 | 8/1989 | (JP). |

OTHER PUBLICATIONS

Ahn et al., :Micro Villus Patterning (MVP) Technology for 256Mb DRAM Stack Cell, *IEEE 1992*, pp. 12–13.

Ema et al., "3–Dimensional Stacked Capacitor Cell For 16M and 64M DRAMs", *IEEE 1988*, pp. 592–595.

(List continued on next page.)

*Primary Examiner*—Jey Tsai
(74) *Attorney, Agent, or Firm*—Wells, St. John, Roberts, Gregory & Matkin, P.S.

(57) ABSTRACT

A semiconductor processing method of forming a contact pedestal includes, a) providing a node location to which electrical connection is to be made; b) providing insulating dielectric material over the node location; c) etching a contact opening into the insulating dielectric material over the node location to a degree insufficient to outwardly expose the node location, the contact opening having a base; d) providing a spacer layer over the insulating dielectric material to within the contact opening to a thickness which less than completely fills the contact opening; e) anisotropically etching the spacer layer to form a sidewall spacer within the contact opening; f) after forming the sidewall spacer, etching through the contact opening base to outwardly expose the node location; g) filling the contact opening to the node location with electrically conductive material; h) rendering the sidewall spacer electrically conductive; and i) etching the electrically conductive material to form an electrically conductive contact pedestal comprising the sidewall spacer, the pedestal having an outer surface which is substantially coplanar with opposing laterally adjacent electrically insulative surfaces. Also disclosed is integrated circuitry including contact pedestals. Also disclosed are methods of forming storage nodes of capacitors.

35 Claims, 14 Drawing Sheets

U.S. PATENT DOCUMENTS

| | | |
|---|---|---|
| 4,994,893 | 2/1991 | Ozaki et al. ..................... 437/228 |
| 5,010,039 | 4/1991 | Ku et al. ........................... 357/23.6 |
| 5,045,899 | 9/1991 | Arimoto ............................ 357/59 |
| 5,047,817 | 9/1991 | Wakamiya et al. ................ 437/977 |
| 5,068,711 | 11/1991 | Mise .................................. 437/52 |
| 5,134,086 | 7/1992 | Ahn .................................... 437/47 |
| 5,166,090 | 11/1992 | Kim et al. .......................... 437/47 |
| 5,170,243 | 12/1992 | Dhong et al. . |
| 5,192,703 | 3/1993 | Lee et al. . |
| 5,206,183 | 4/1993 | Dennison . |
| 5,227,322 | 7/1993 | Ko et al. ............................ 437/60 |
| 5,231,296 | 7/1993 | Rodder ............................... 437/52 |
| 5,243,220 | 9/1993 | Shibata et al. . |
| 5,266,514 | 11/1993 | Tuan et al. ......................... 437/52 |
| 5,292,678 | 3/1994 | Dhong et al. . |
| 5,330,934 | 7/1994 | Shibata et al. . |
| 5,338,700 | 8/1994 | Dennison et al. . |
| 5,340,763 | 8/1994 | Dennison . |
| 5,340,765 | 8/1994 | Dennison et al. . |
| 5,354,712 | 10/1994 | Ho et al. . |
| 5,362,666 | 11/1994 | Dennison . |
| 5,401,681 | 3/1995 | Dennison . |
| 5,451,539 | * 9/1995 | Ryou . |
| 5,464,787 | * 11/1995 | Ryou . |
| 5,468,671 | 11/1995 | Ryon . |
| 5,492,850 | * 2/1996 | Ryou . |
| 5,538,592 | 7/1996 | Chen et al. . |
| 5,556,802 | 9/1996 | Bakeman, Jr. et al. . |
| 5,597,756 | 1/1997 | Fazan et al. . |
| 5,604,147 | 2/1997 | Fischer et al. . |
| 5,605,857 | 2/1997 | Jost et al. . |
| 5,608,247 | 3/1997 | Brown . |
| 5,629,539 | 5/1997 | Aoki et al. . |
| 5,677,557 | 10/1997 | Wuu et al. . |
| 5,686,747 | 11/1997 | Jost et al. . |
| 5,700,731 | 12/1997 | Lin et al. . |
| 5,702,990 | 12/1997 | Jost et al. . |
| 5,705,838 | 1/1998 | Jost et al. . |
| 5,789,304 | 8/1998 | Gratzel et al. . |
| 5,801,079 | 9/1998 | Takaishi . |
| 5,821,140 | 10/1998 | Jost et al. . |
| 5,900,660 | 4/1999 | Jost et al. . |

OTHER PUBLICATIONS

Hayashide et al., "Fabrication of Storage Capacitance–Enhanced Capacitors with a Rough Electrode", Extended Abstracts of the 22nd Conference on Solid State Devices and Materials, Sendai, 1990, pp. 869–872.

Iguchi et al., "A Novel DRAM Memory Cell with Inclined–Channel Transistor And Ring–Like Structure Produced Through Self/–Aligned Storage Contact Process", Symposium on VLSI Technologies, 1991.

Inoue et al., "A Spread Stacked Capacitor (SSC) Cell For 64MBit DRAMs", *IEEE 1989*, pp. 31–34.

Itoh et al., "Two Step Deposited Rugged Surface (TDRS) Storaegenode And Self Aligned Bitline–Contact Cellplate (SABPEC) for 64MbDRAM STC Cell", Symposium on VLSI Technologies, date unknown.

Kaga et al., "Crown–Shaped Stacked–Capacitor Cell For 1.5–V Operation 64–Mb DRAMs", *IEEE*, Feb. 1991.

Kawamoto et al., "A 1.28 Bit–Line Shielded Memory Cell Technology For 64MB DRAMs", Symposium on VLSI Technology 1990.

Kusters, et al., "A Stacked Capacitor Cell With A Fully Self–Aligned Contact Process For High Density Random Access Memories", J. Electrochem. Soc. vol. 139, No. 8, Aug. 1992.

Ozaki et al., "A Fence Stacked Capacitor (FSC) Cell For 256 Mbit DRAMs"., date and publisher unknown.

Shibata et al., "A Novel Zero–Overlap/Enclosure Metal Interconnection Technology", VMIC Confeence 1990, pp. 15–21, publisher unknown.

Temmier, "Multilayer Vertical Stacked Capacitors (MVSTC) For 64Mbit and 256 Mbit DRAMSs", date and publisher unknown.

Wakamiya et al., "Novel Stacked Capacitor Cell For 64Mb DRAM", date publisher unknown.

"Stacked Capacitor DRAM Cell With Vertical Fins (VF–STC)", IBM Technical Disclosure Bulletin, vol. 33, No. 2, Jul. 1990.

* cited by examiner

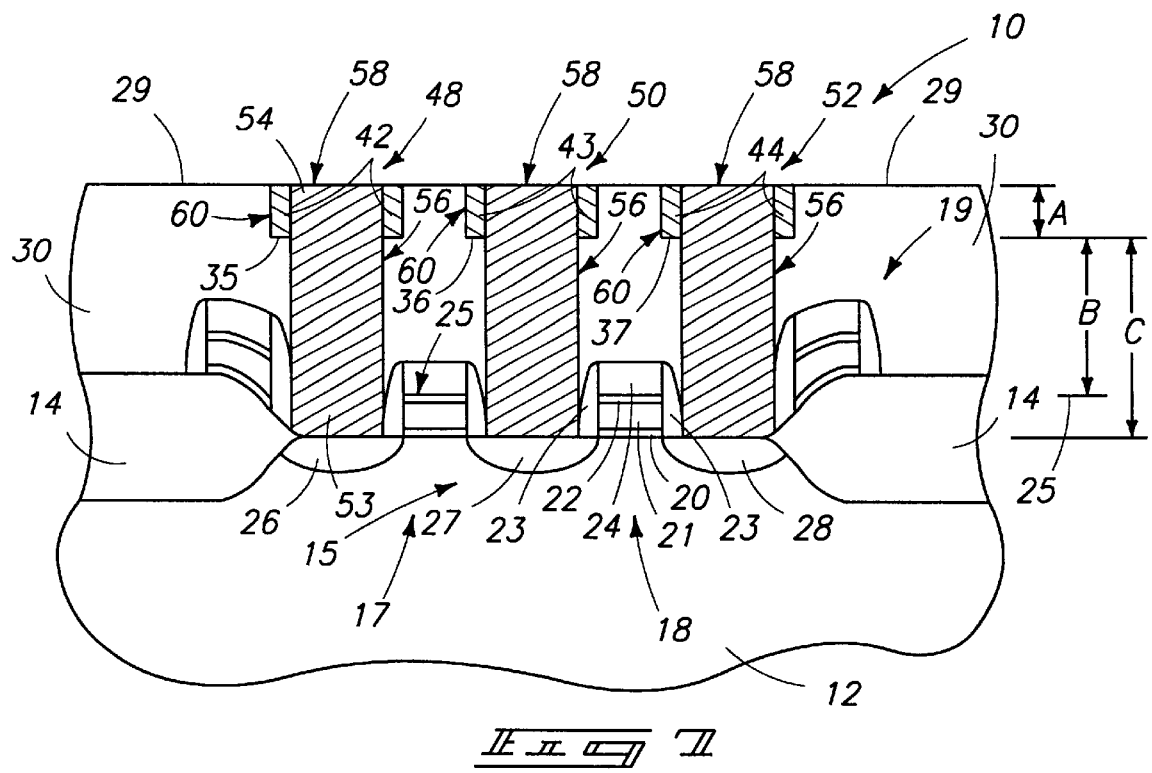
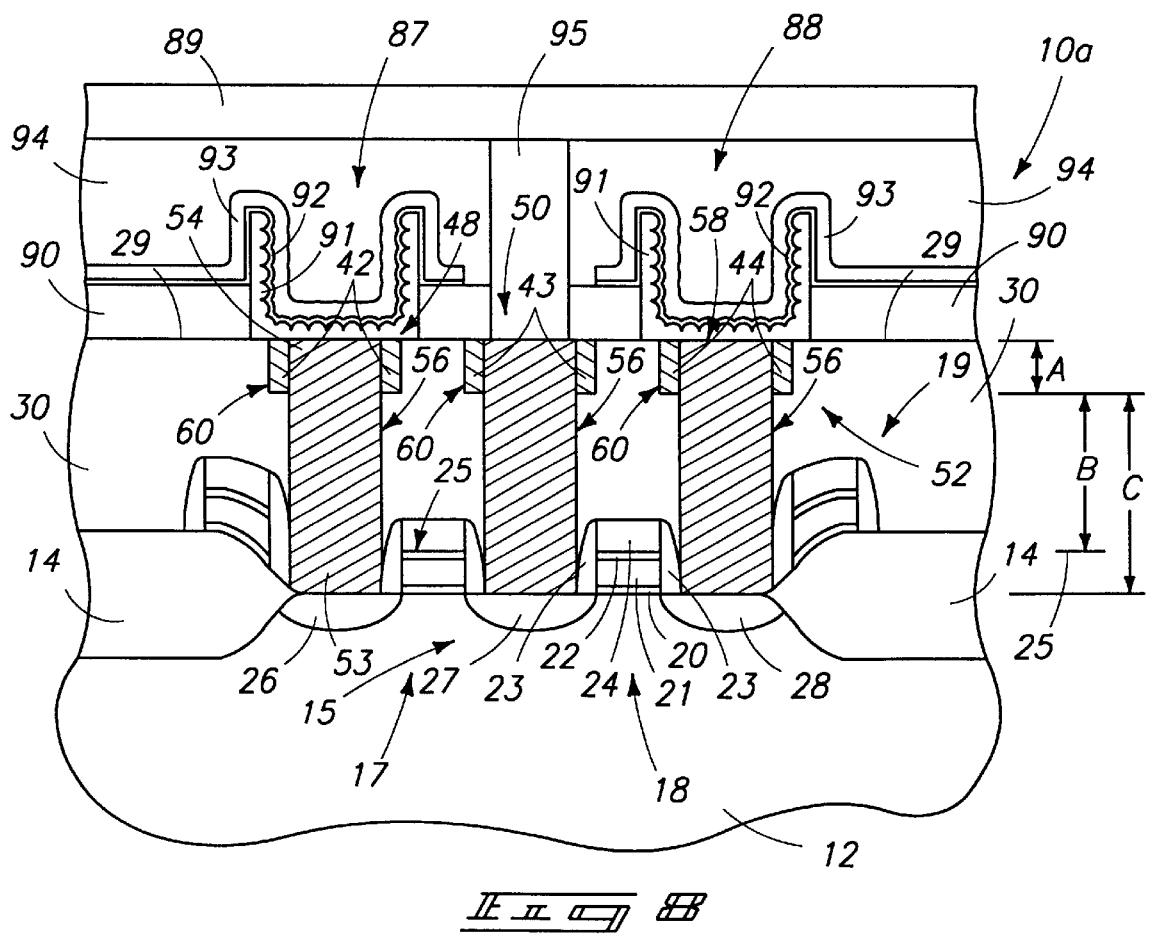

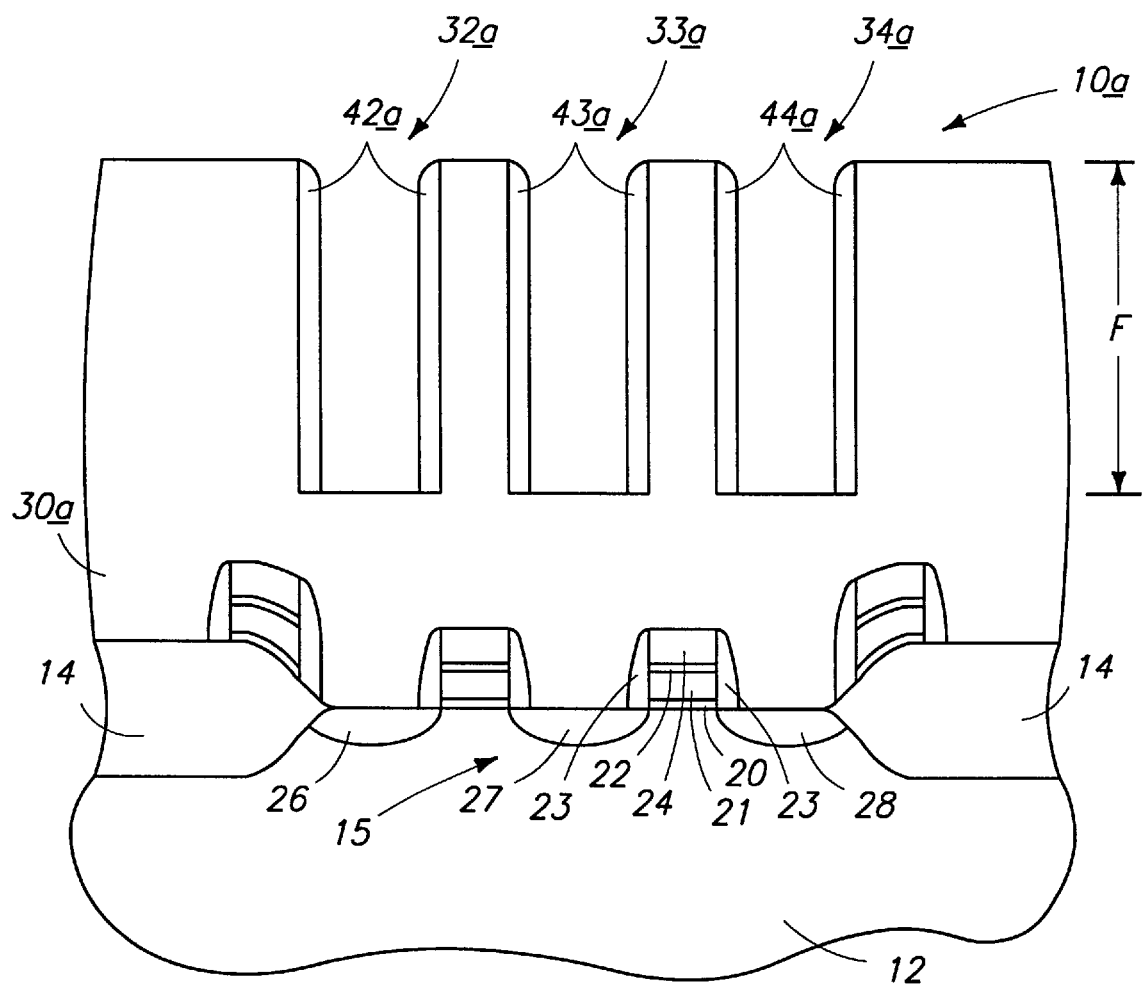

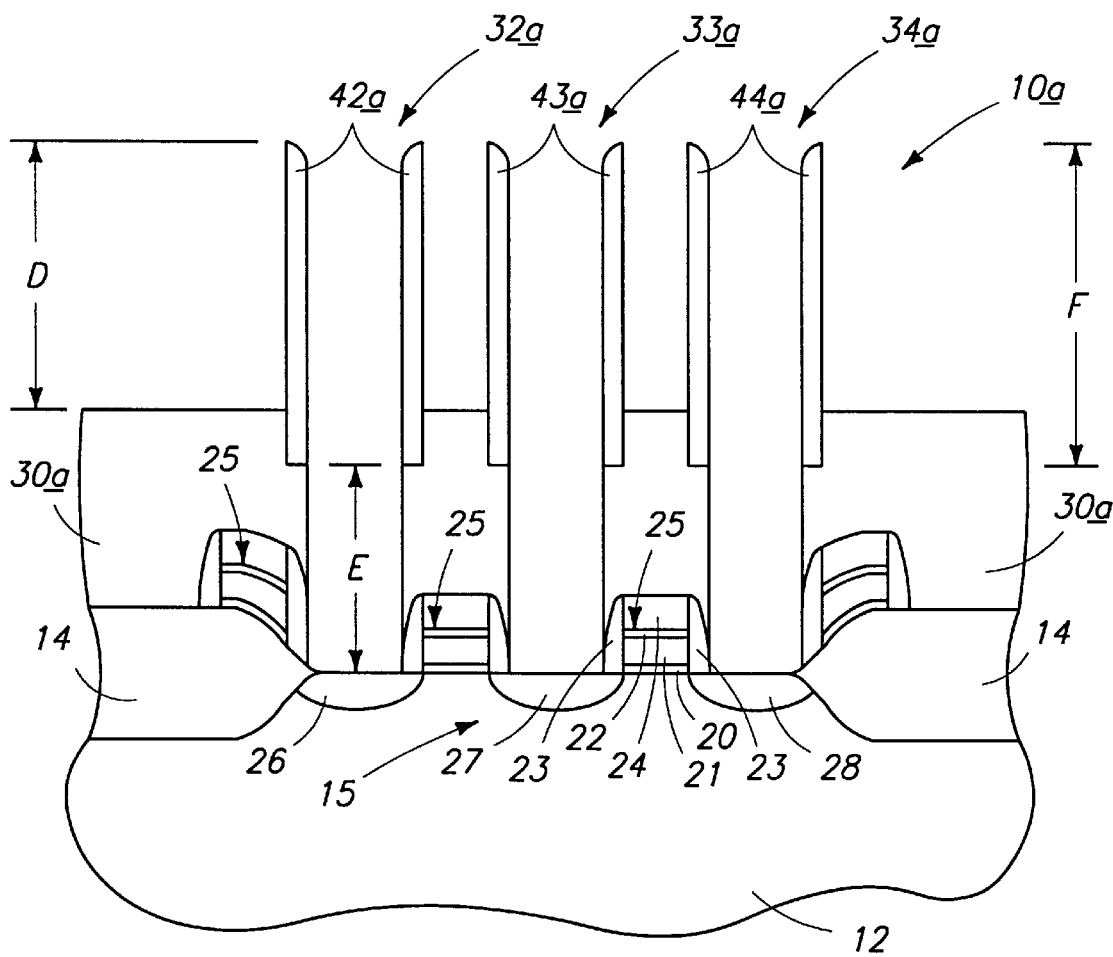

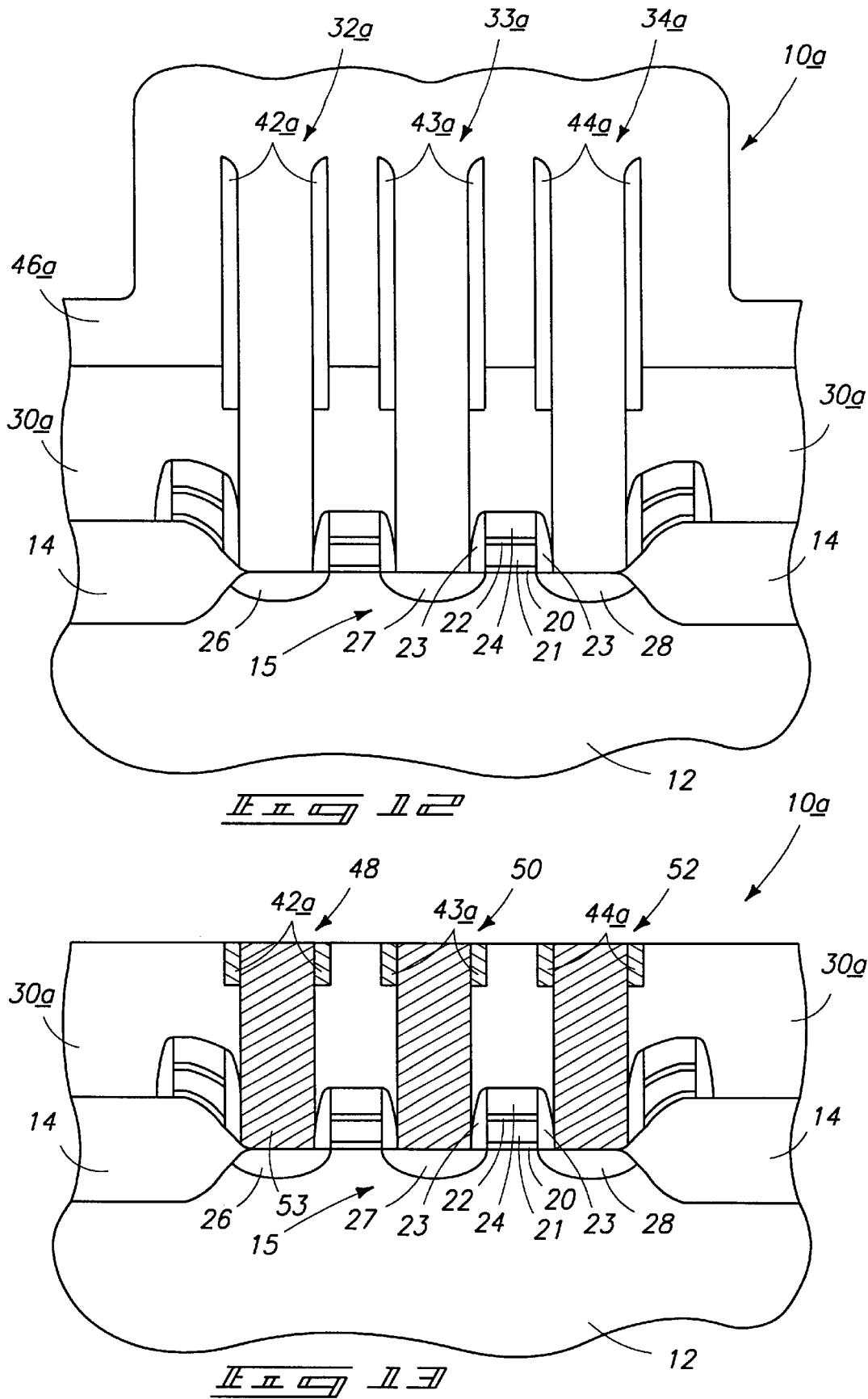

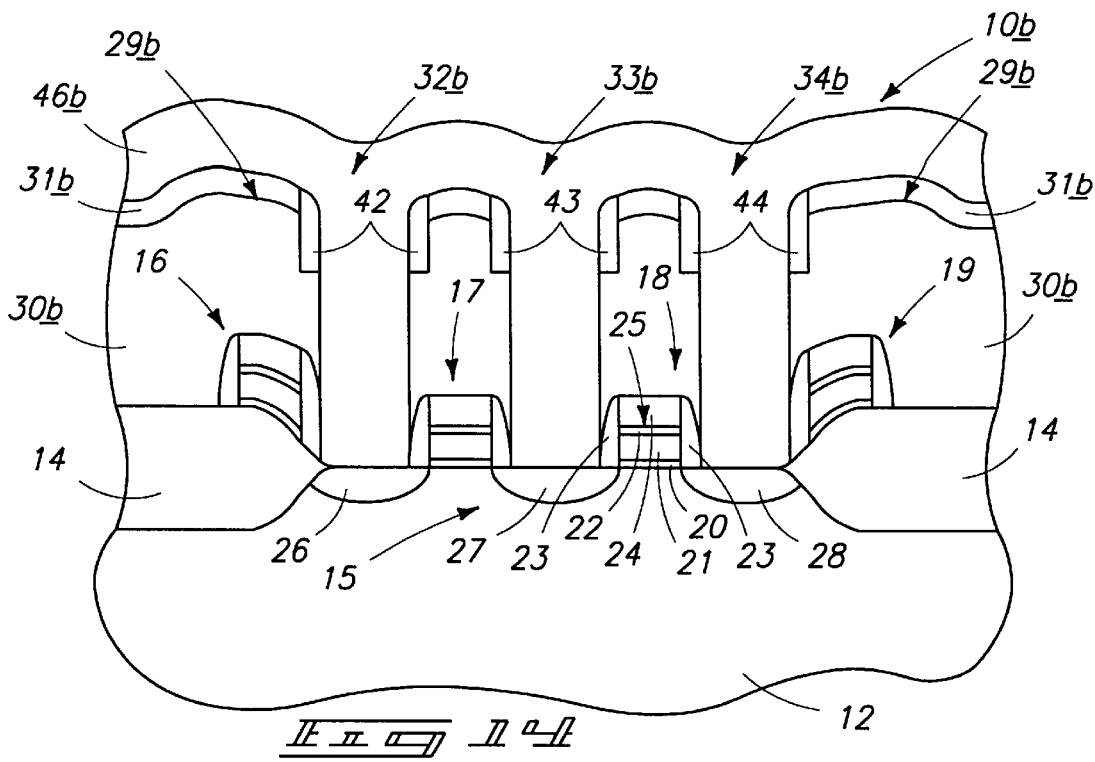
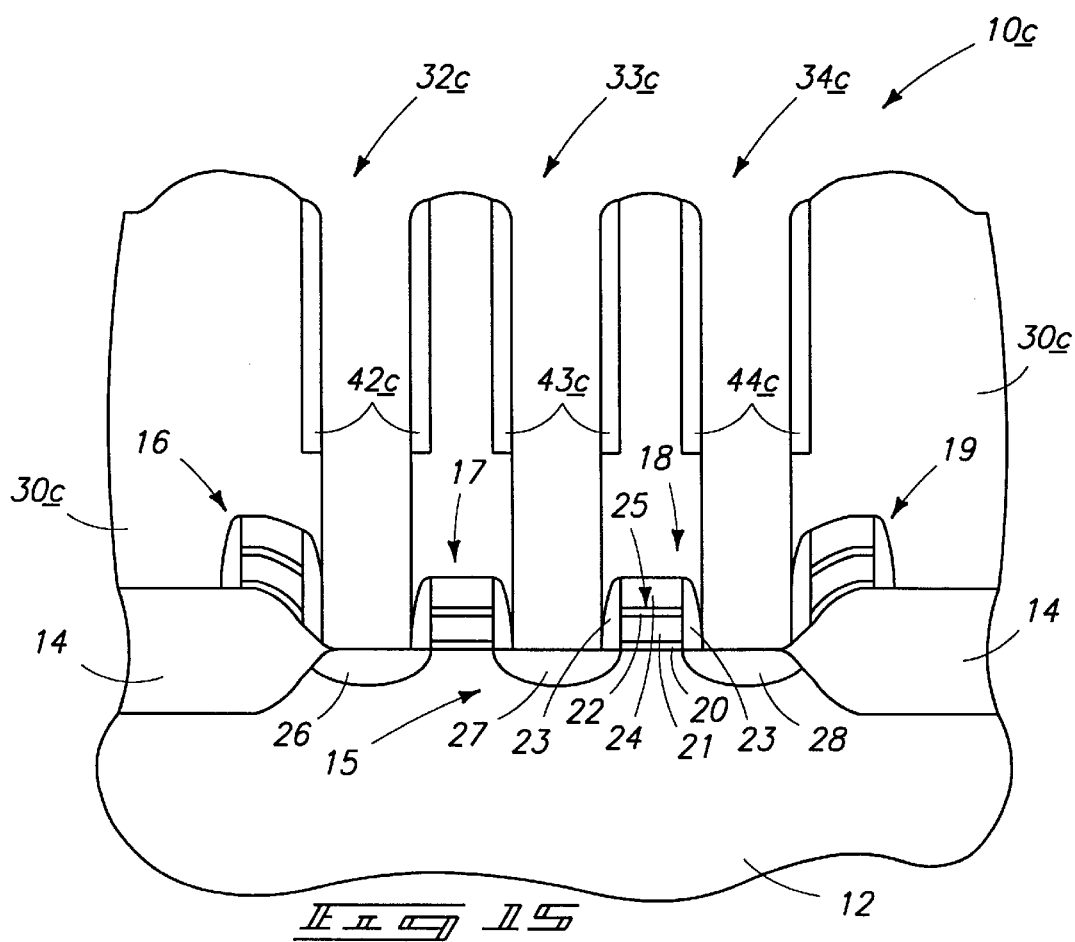

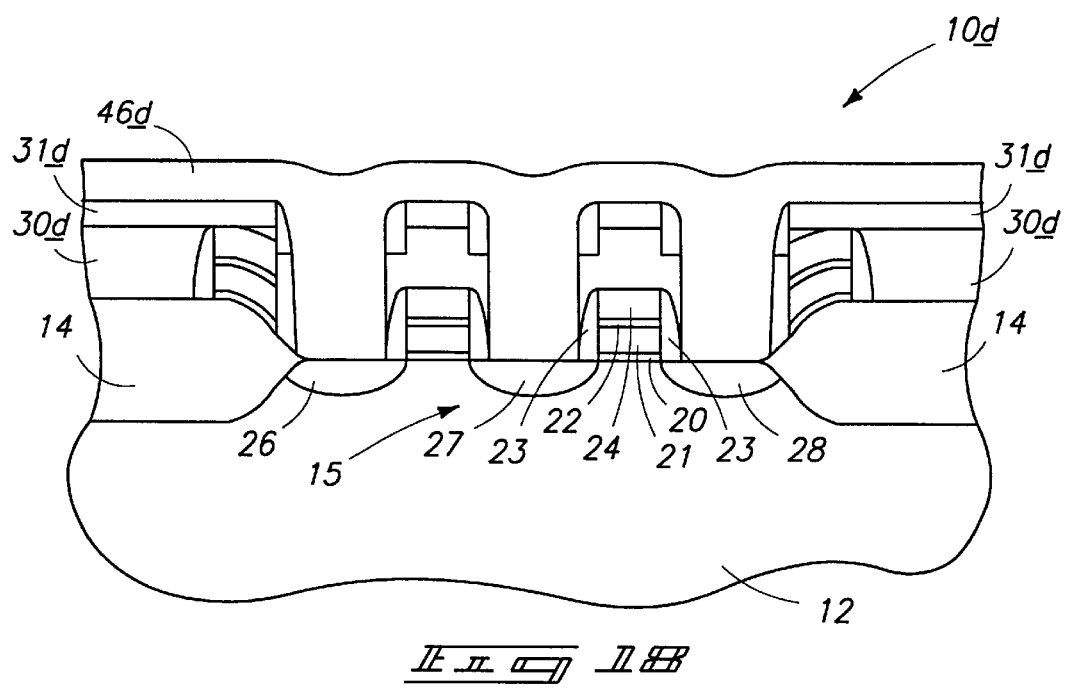
_FIG. 18_
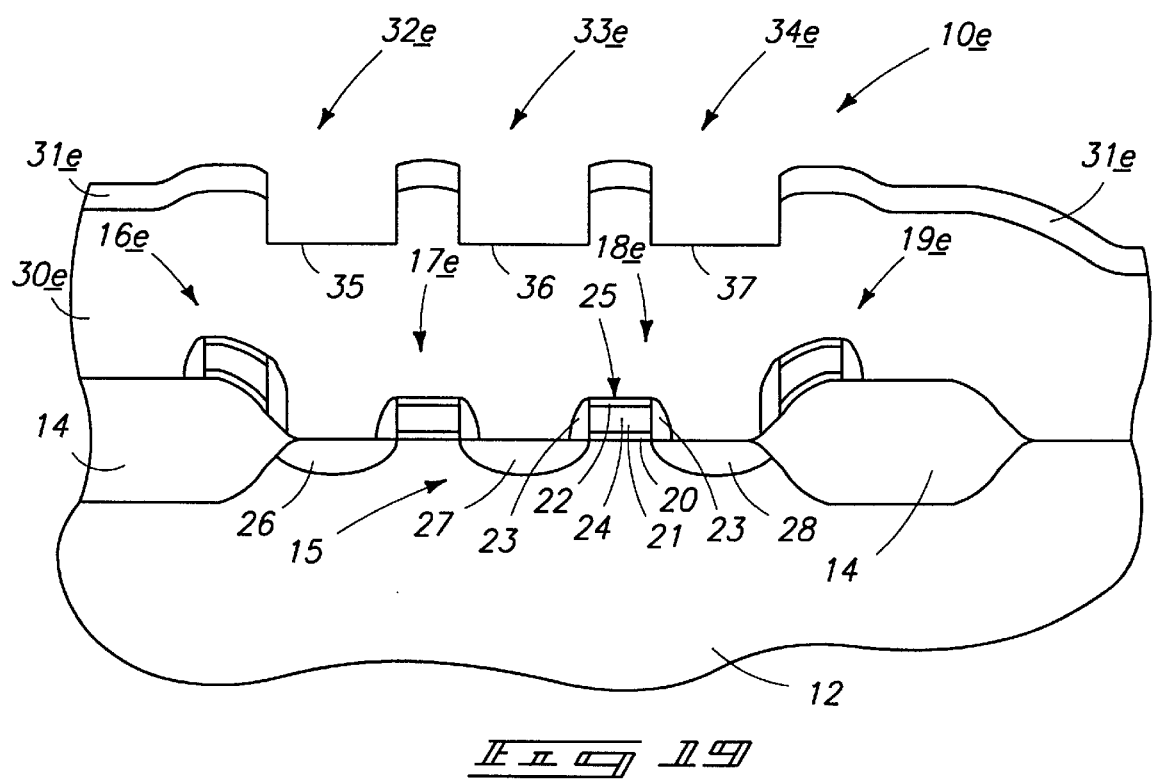
_FIG. 19_

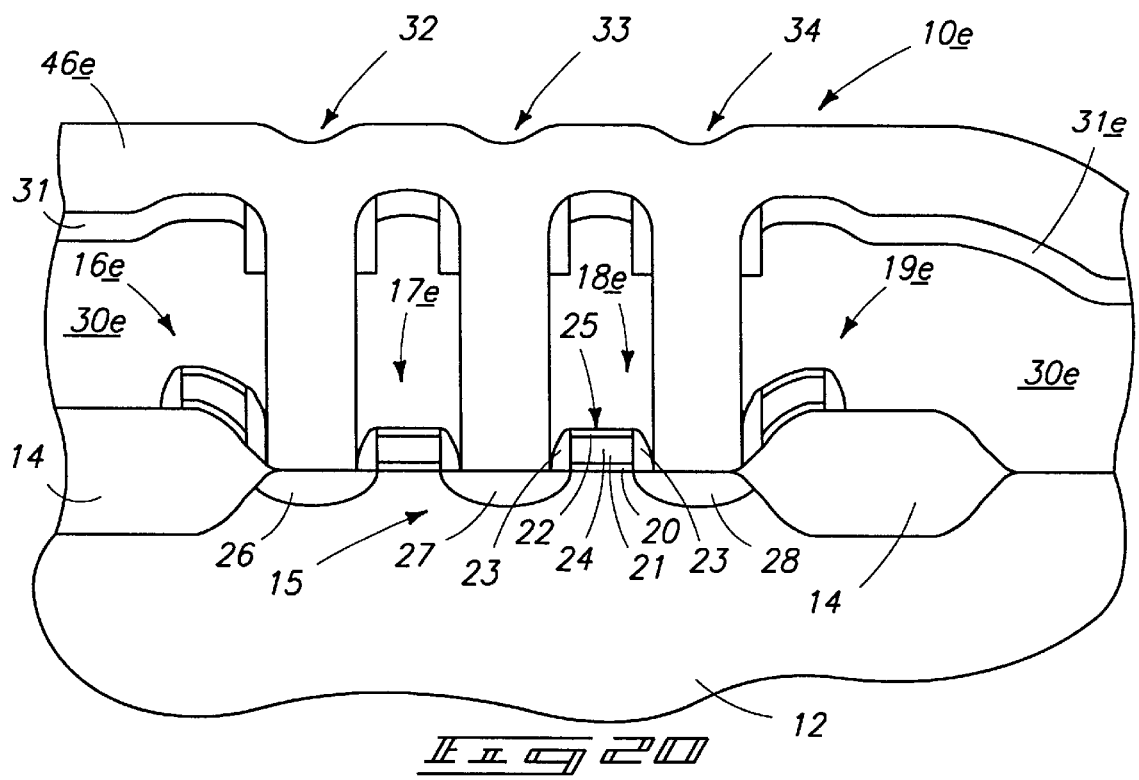
_Fig 20_
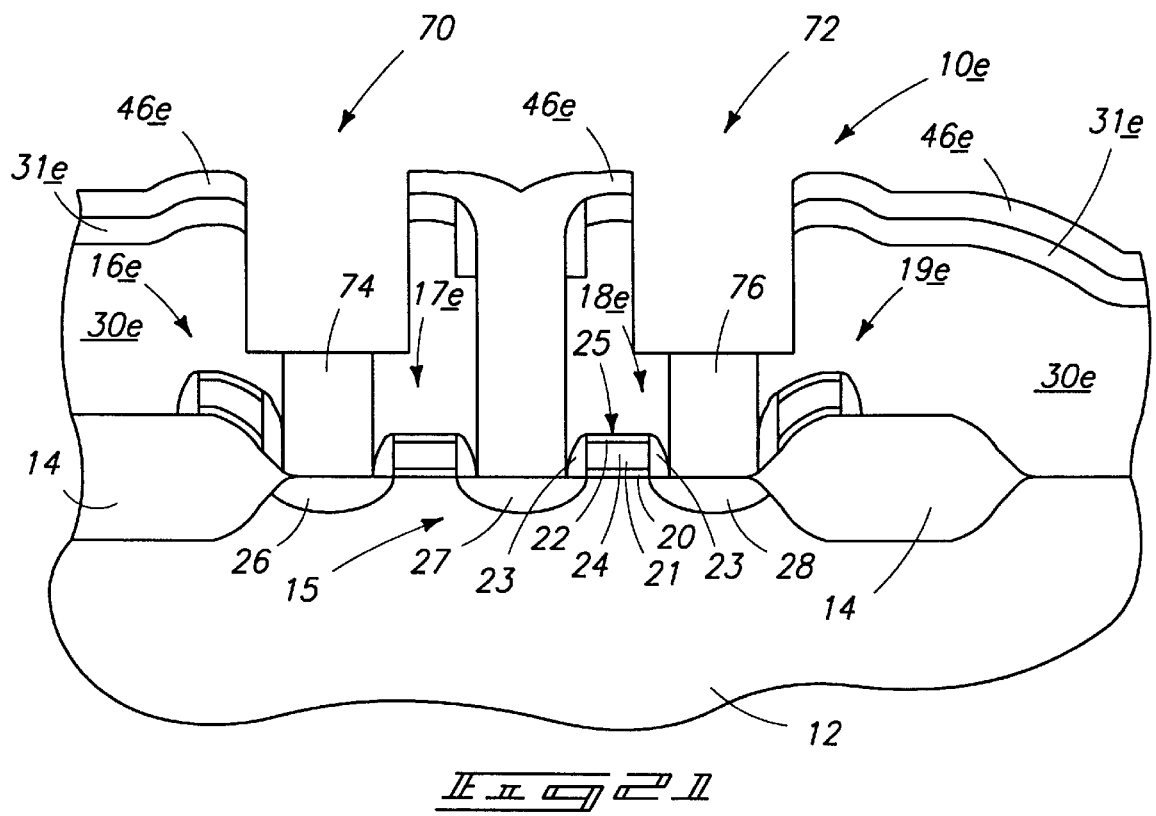
_Fig 21_

SEMICONDUCTOR PROCESSING METHOD OF FORMING A CONTACT PEDESTAL OF FORMING A STORAGE NODE OF A CAPACITOR AND INTEGRATED CIRCUITRY

RELATED PATENT DATA

This patent resulted from a continuation application of U.S. patent application Ser. No. 08/622,591, filed on Mar. 26, 1996, U.S. Pat. No. 6,083,831.

TECHNICAL FIELD

This invention relates to semiconductor processing methods of forming contact pedestals and to integrated circuitry employing contact pedestals. The invention also relates to methods of forming a storage node of a capacitor.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the wordlines and bit lines. With non-buried bit line constructions, deep vertical contacts are made through a thick insulating layer to the cell FETs, with the capacitor constructions being provided over the word lines and beneath the bit lines. Such non-buried bit line constructions are also referred to as "capacitor-under-bit line" or "bit line-over-capacitor" constructions.

In DRAM and other integrated circuitry, ohmic electrical contact is typically made relative to an electrically conductive diffusion region s in a semiconductor substrate between a pair of conductive lines provided over the substrate. In some instances, contact plugs or pedestals are utilized to facilitate making electrical connection to the substrate, and contend with adverse vertical topography. Such can provide the advantage of producing a larger targeting area for a subsequent conductive line contact to the diffusion region through the pedestal. My earlier U.S. Pat. Nos. 5,338,700; 5,340,763; 5,362,666; and 5,401,681 are hereby incorporated by reference into this disclosure.

BRIEF DESCRIPTION OF THE DRAWINGS

Preferred embodiments of the invention are described below with reference to the following accompanying drawings.

FIG. 7 is a view of the FIG. 1 wafer fragment at a processing step subsequent to that depicted by FIG. 6.

FIG. 8 is a view of the FIG. 1 wafer fragment at a processing step subsequent to that depicted by FIG. 7.

FIG. 10 is a view of the FIG. 9 wafer fragment at a processing step subsequent to that depicted by FIG. 9.

FIG. 11 is a view of the FIG. 9 wafer fragment at a processing step subsequent to that depicted by FIG. 10.

FIG. 12 is a view of the FIG. 9 wafer fragment at a processing step subsequent to that depicted by FIG. 11.

FIG. 13 is a view of the FIG. 9 wafer fragment at a processing step subsequent to that depicted by FIG. 12.

FIG. 14 is a diagrammatic sectional view of another alternate embodiment semiconductor wafer fragment at another alternate processing step in accordance with the invention.

FIG. 15 is a diagrammatic sectional view of still another alternate embodiment semiconductor wafer fragment at yet another alternate processing step in accordance with the invention.

FIG. 18 is a view of the FIG. 17 wafer. fragment at a processing i step subsequent to that depicted by FIG. 17.

FIG. 19 is a diagrammatic sectional view of still yet another alternate embodiment semiconductor wafer fragment at still yet another alternate processing step in accordance with the invention.

FIG. 20 is a view of the FIG. 19 wafer fragment at a processing step subsequent to that depicted by FIG. 19.

FIG. 21 is a view of the FIG. 19 wafer fragment at a processing step subsequent to that depicted by FIG. 20.

DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a contact pedestal comprises:

providing a node location to which electrical connection is to be a made;

providing insulating dielectric material over the node location;

etching a contact opening into the insulating dielectric material over the node location to a degree insufficient to outwardly expose the node location, the contact opening having a base;

providing a spacer layer over the insulating dielectric material to within the contact opening to a thickness which less than completely fills the contact opening;

anisotropically etching the spacer layer to form a sidewall spacer within the contact opening;

after forming the sidewall spacer, etching through the contact opening base to outwardly expose the node location;

filling the contact opening to the node location with electrically conductive material;

rendering the sidewall spacer electrically conductive; and etching the electrically conductive material to form an electrically conductive contact pedestal comprising the sidewall spacer, the pedestal having an outer surface which is substantially coplanar with opposing laterally adjacent electrically insulative surfaces.

In another aspect, integrated circuitry comprises:

a node location;

an electrically conductive longitudinal contact pedestal in electrical connection with the node location, the contact pedestal comprising:

an inner longitudinal portion in electrical connection with the node location and an outer longitudinal portion, the outer longitudinal portion comprising an anisotropically etched sidewall spacer and a radially inner electrically conductive pillar, the spacer being electrically conductive and in ohmic electrical connection with the pillar;

the pillar and spacer having a substantially coplanar common outer surface; and insulating dielectric material having a substantially planar outer surface which is substantially coplanar with the contact pedestal common outer surface.

In accordance with yet another aspect, a semiconductor processing method of forming a storage node of a capacitor comprises:

providing an electrically conductive pillar within a mass of insulating material;

etching the pillar and mass of insulating material at substantially the same rate to form a capacitor container opening within the mass; of insulating material, the pillar projecting form the capacitor container opening; and providing a capacitor storage node within the capacitor container opening in electrical connection with the pillar.

Figure 1:
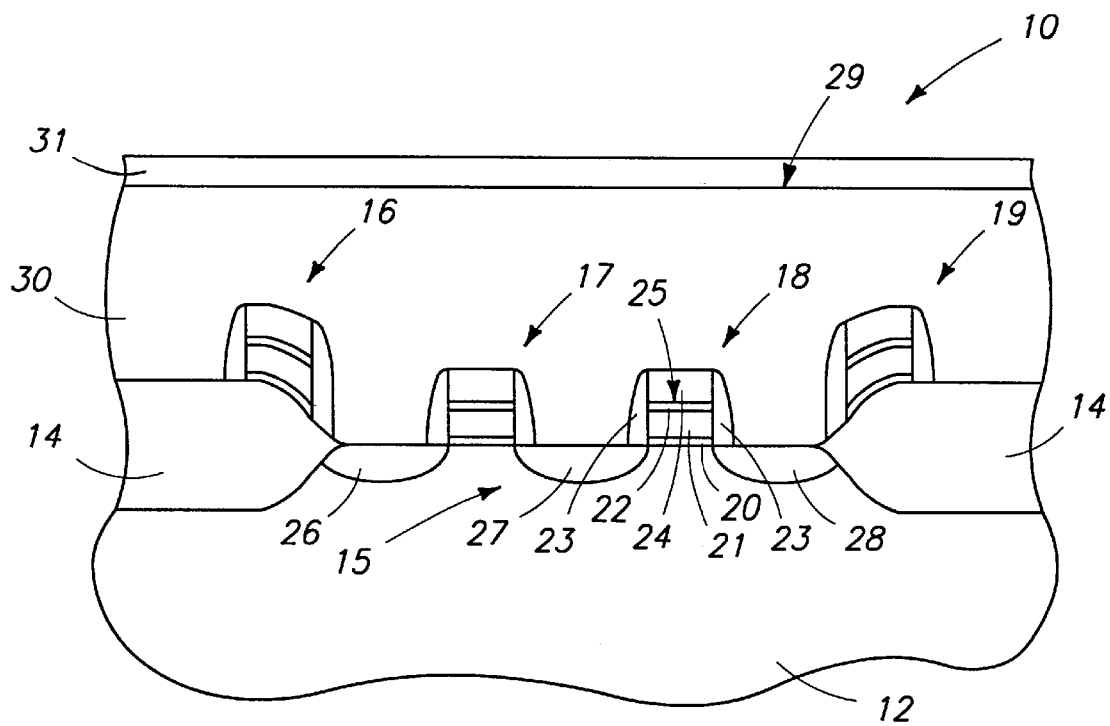
FIG. 1 a diagrammatic sectional view of a semiconductor wafer fragment at one processing step in accordance with the invention.

A first embodiment is described with reference to FIGS. 1–7. FIG. 1 illustrates a semiconductor wafer fragment 10 comprised of a bulk monocrystalline silicon substrate 12 and a spaced pair of field oxide regions 14. Regions 14 define active area 15 therebetween. A series of four wordline construction 16, 17, 18 and 19 are provided relative to substrate 12. In the depicted cross-sectional view of wafer fragment 10, wordlines 16 and 19 overlie the opposing field oxide regions 14, and wordlines 17 and 18 constitute a pair of wordlines which overlie active area 15. Wordlines 16, 17, 18 and 19 respectively comprise a gate dielectric layer 20, an overlying conductively doped polysilicon layer 21, an associated silicide layer 22, electrically insulative sidewall spacers 23, and a cap 24. Such can be provided of conventional construction, with spacers 23 and cap 24 for example comprising an oxide, nitride or other electrically insulative material. For purposes of the continuing discussion, the subject wordlines respectively have an outermost conductive surface 25 which in the preferred embodiment is the topmost surface of refractory silicide layer 22. Conductively doped diffusions regions 26, 27 and 28 are provided within substrate 12 alternatingly adjacent wordlines 17 and 18 as shown, and constitute respective first, second and third active area node locations to which respective electrical connection will be made.

An insulating dielectric material layer 30, preferably borophoshosilicate glass (BPSG), is provide over the wordlines and node locations. In this embodiment, insulating dielectric layer 30 is planarized to have a planarized outer surface 29, and provided to have a preferred thickness above node locations 26, 27 and 28 of from about 8,000 Angstroms to about 12,000 Angstroms. An example thickness of layer 30 above the outermost portion of caps 24 of wordlines 16 and 19 is about 4,500 Angstroms. If desired, a thin barrier layer (not shown), such as undoped $SiO_2$ deposited by decomposition of tetraethylorthosilicate or a silicon nitride layer, can be provided over the substrate prior to deposition of layer 30 to serve as a shield to undesired boron or phosphorous diffusion from BPSG layer 30 into substrate 12.

A hard mask or etch stop layer 31 is provided outwardly of insulating dielectric layer 30. Such preferably comprises a material to which underlying insulating dielectric layer 30 can be substantially selectively etched, as will be apparent from the continuing description. Example and preferred materials for layer 31 include doped or undoped polysilicon, or $Si_3N_4$. An example thickness for layer 31 is 2500 Angstroms.

Figure 2:
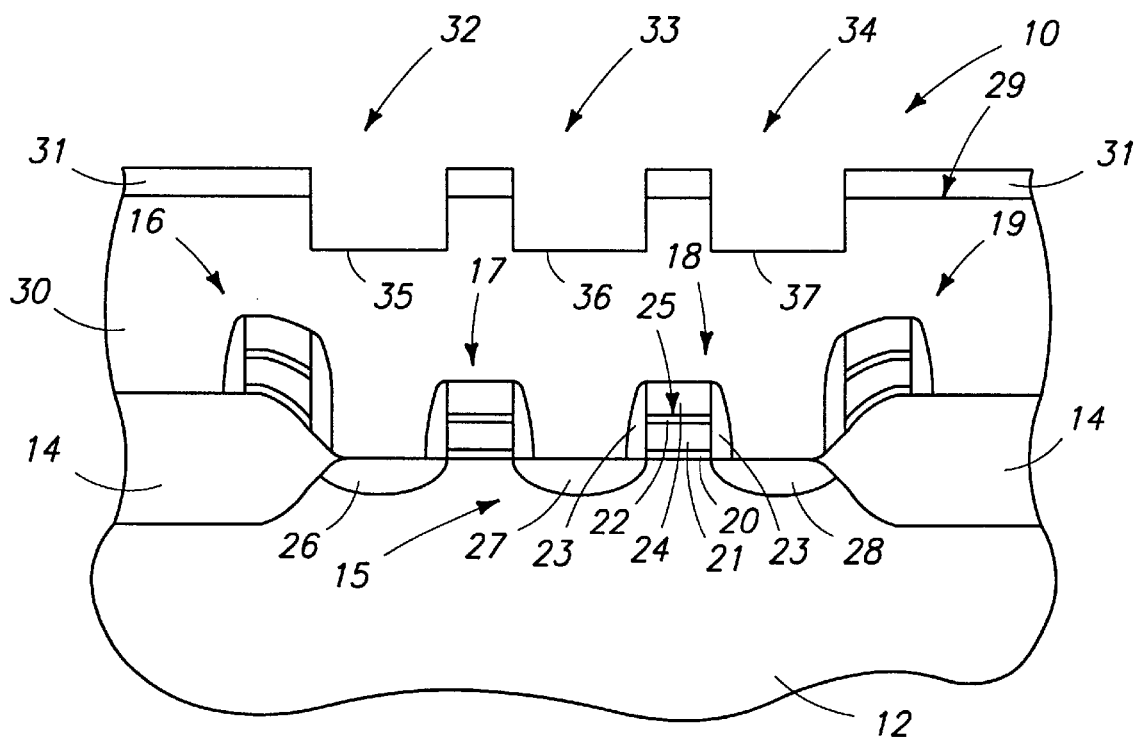
FIG. 2 is a view of the FIG. 1 wafer fragment at a processing step subsequent to that depicted by FIG. 1.

Referring to FIG. 2, contact openings 32, 33 and 34 are etched into hard mask layer 31 and insulating dielectric material layer 30. Contact opening 32 constitutes a first contact opening etched over first node location 26. Contact opening 33 constitutes a second contact opening etched over second node location 27. Contact opening 34 constitutes a third contact opening 34 etched over third node location 28. Each is etched into insulating dielectric layer 30 to a degree which is insufficient to outwardly expose the underlying respective node locations. An example preferred etch depth into layer 30 is 3,500 Angstroms. Contact openings 32, 33 afi 34 include first, second and third contact bases 35, 36 and 37, respectively, which are positioned elevationally outward of wordlines 16, 17, 18, 19 and their associated outermost conductive surfaces 25.

Figure 3:
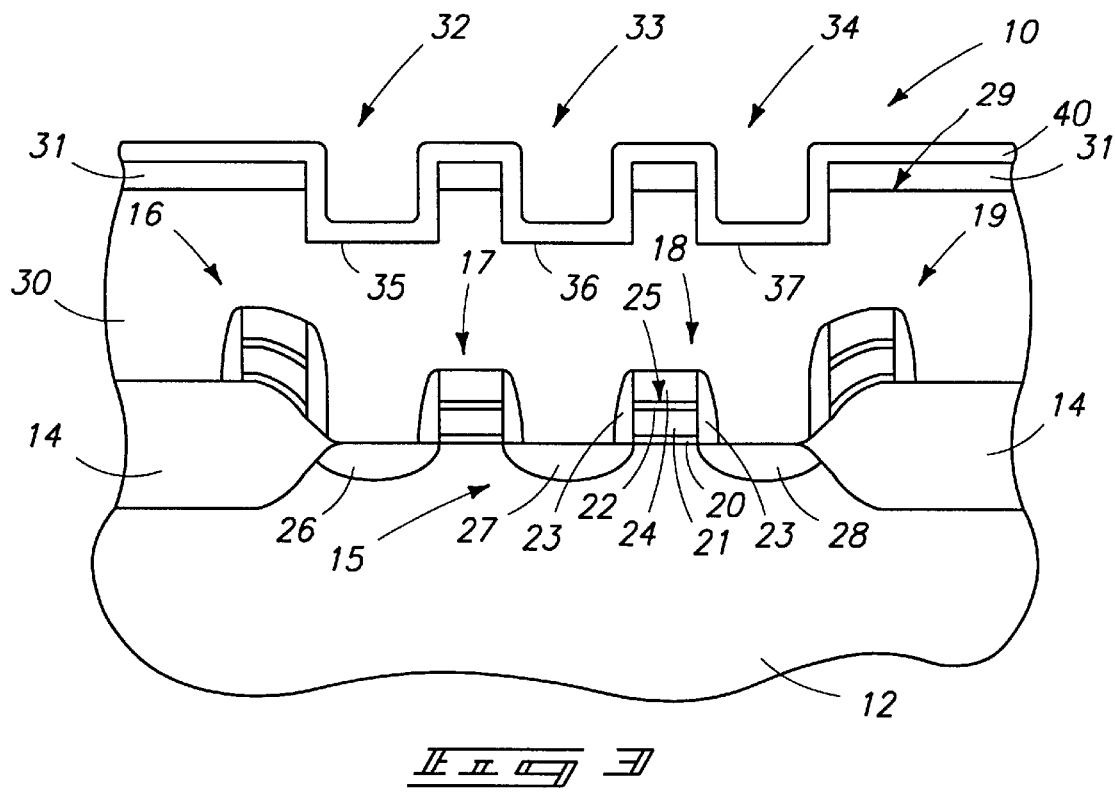
FIG. 3 is a view of the FIG. 1 wafer fragment at a processing step subsequent to that depicted by FIG. 2.

Referring to FIG. 3, a spacer layer 40 is provided over masking layer 31, and accordingly over insulating dielectric material 30, to a suitable thickness which less than completely fills the respective contact openings 32, 33 and 34. Such will be utilized to ultimately produce electrically conductive anisotropically etched sidewall spacers. Example and preferred materials for layer 40 at this point in the process include either doped or undoped polysilicon.

Figure 4:
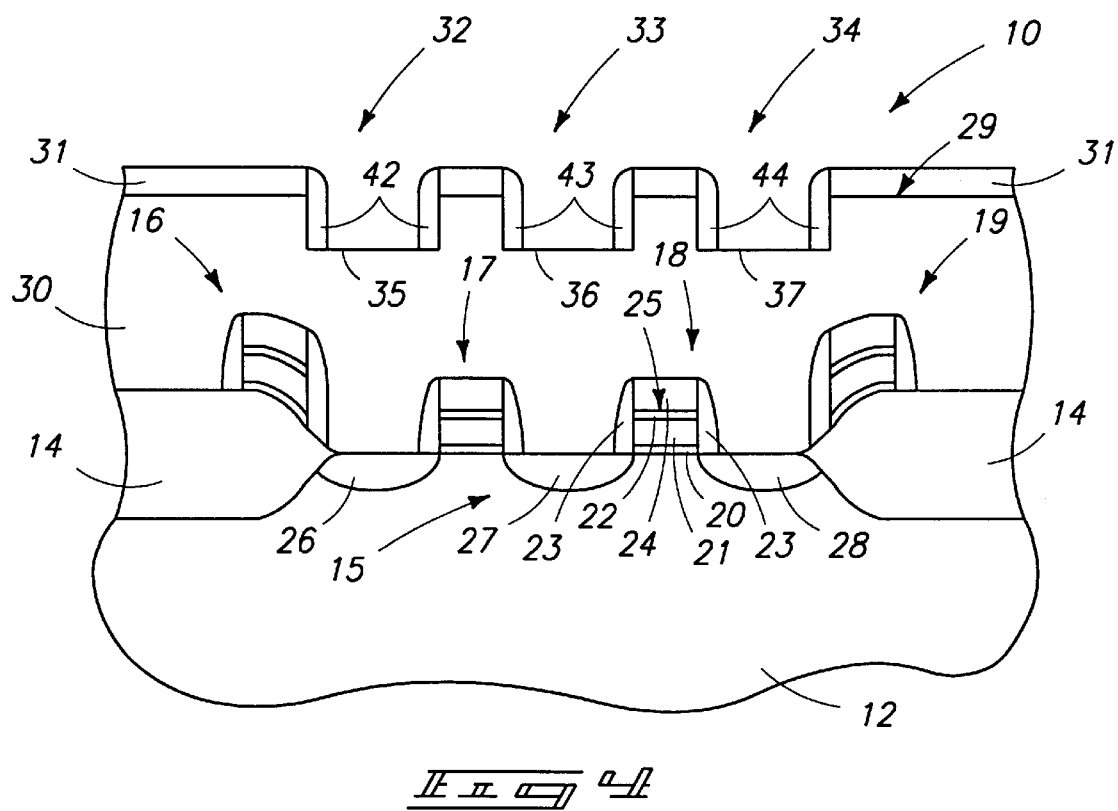
FIG. 4 is a view of the FIG. 1 wafer fragment at a processing step subsequent to that depicted by FIG. 3.

Referring to FIG. 4, spacer layer 40 is anisotropically etched to form a first sidewall spacer 42 within first contact opening 32, a second sidewall spacer 43 within second contact opening 33, and a third sidewall spacer 44 within third contact opening 34. Such sidewall spacers are ultimately rendered to be electrically conductive and constitute laterally outward portions of an electrically conductive contact pedestal. Accordingly, where spacer layer 40 is provided to be electrically conductive prior to the anisotropic etching to produce the construction of FIG. 4, spacers 42, 43 and 44 will be electrically conductive immediately upon their formation. Where spacer layer 40 is not provided to be electrically conductive prior to the FIG. 4. anisotropic etching, spacers 42, 43 and 44 can be rendered electrically conductive after their formation by diffusion doping, ion implant, or some other method.

Figure 5:
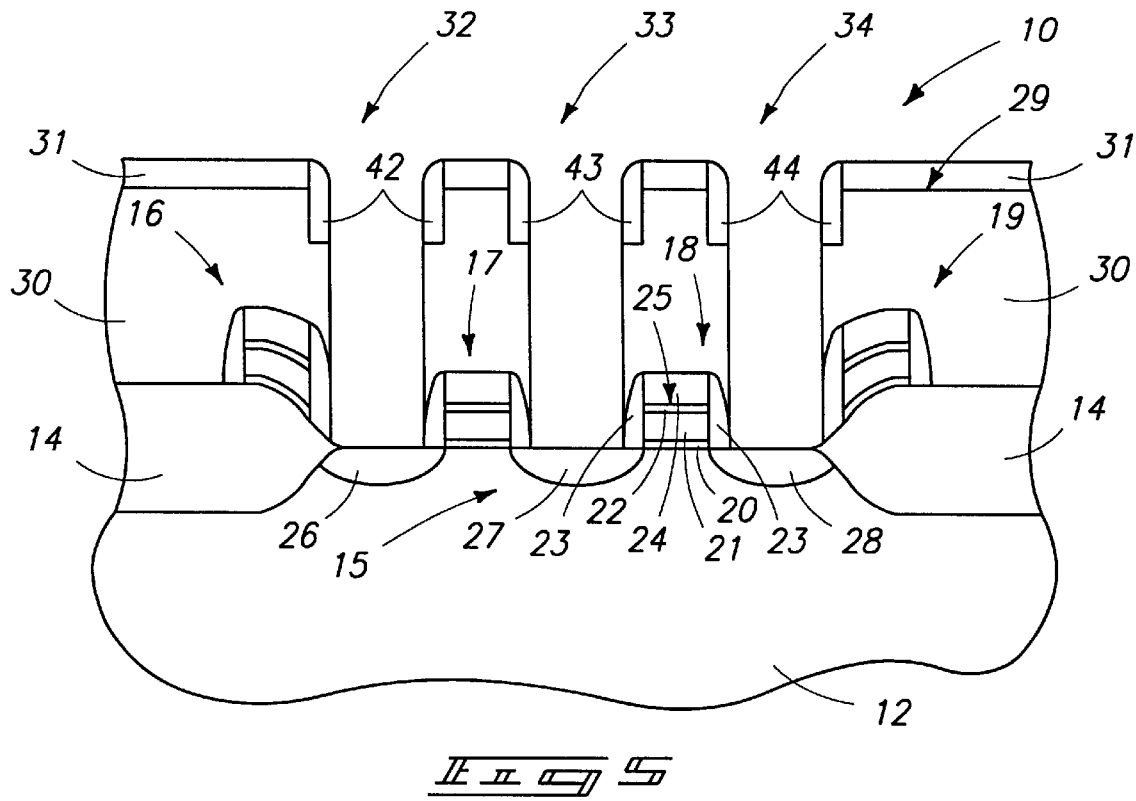
FIG. 5 is a view of the FIG. 1 wafer fragment at a processing step subsequent to that depicted by FIG. 4.

Referring to FIG. 5, and after etching anisotropic spacer layer 40, etch chemistry is changed to etch through first, second and third contact opening bases 35, 36, and 37, respectively, to outwardly expose node locations 26, 27 and 28, respectively. During such etching, hard mask or etch stop layer 31 restricts etching of insulating dielectric material layer 30 thereunder. If sidewall spacers 23 of the subject wordline constructions constitute nitride, as in this example, such layers are preferably not appreciably etched during the etching of BPSG layer 30. If the material of spacers 23 comprises oxide, such material will more typically be etched during the etch of layer 30 to outwardly expose the node locations, but this should not be problematic. Provision of the illustrated spacers 42, 43 and 44 within contact openings 32, 33, and 34 desirably has the effect of moving the resultant narrowed contact etch to the node locations away from the conductive wordline edges such that exposure thereof will not occur during the etch to expose the node locations. Accordingly, spacers 23 and cap 24 are not a preferred embodiment requirement.

Figure 6:
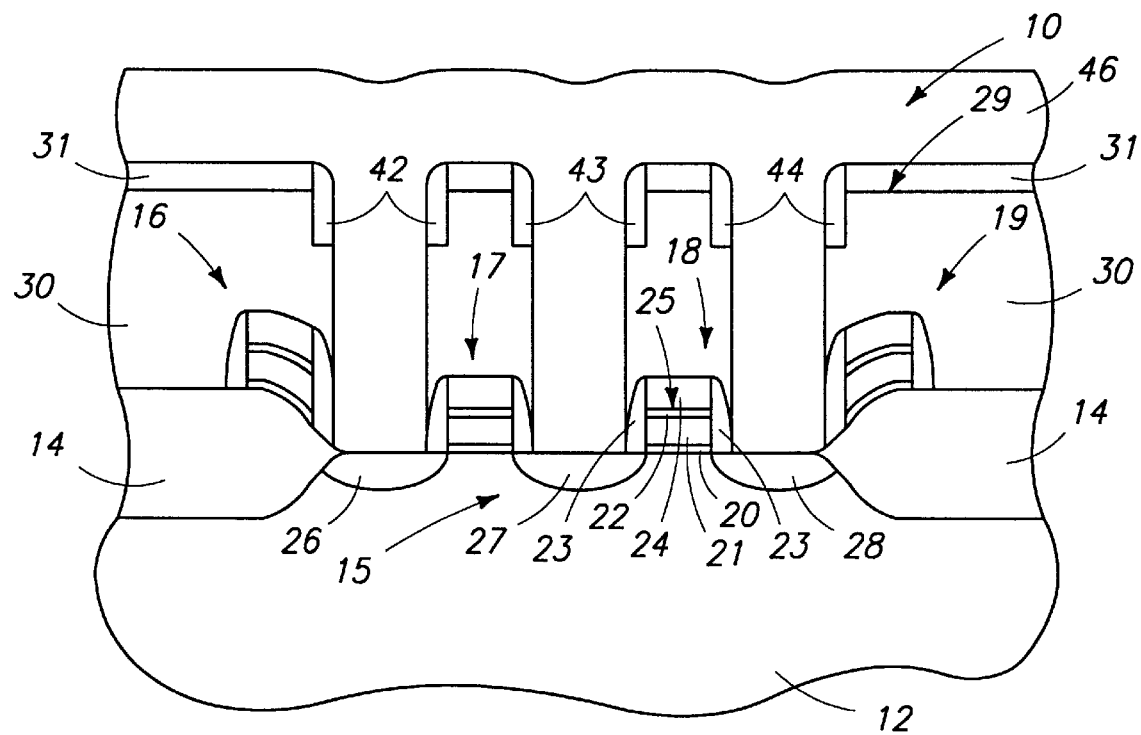
FIG. 6 is a view of the FIG. 1 wafer fragment at a processing step subsequent to that depicted by FIG. 5.

Referring to FIG. 6, remaining first, second, and third contact openings 32, 33, 34, respectively, are filled with an electrically conductive material layer 46, such as in situ conductively doped polysilicon.

Referring to FIG. 7, electrically conductive material layer 46 is etched inwardly to insulating dielectric material layer 30 to form an electrically conductive first contact pedestal 48, an electrically conductive second contact pedestal 50, and an electrically conductive third contact pedestal 52. Each comprises an inner longitudinal portion 53 effectively in electrical connection with the associated node location, and an outer longitudinal portion 54. Outer longitudinal portion 54 for pedestals 48, 50 and 52 comprises anisotropically etched spacers 42, 43, and 44, respectively, and a radially inner electrically conductive pillar 56. Spacers 42, 43 and 44 are in respective ohmic electrical connection with their associated pillars 56, with pillars 56 comprising and extending between outer longitudinal portion 54 and inner longitudinal portion 53 of the respective contact pedestals. Example and preferred etching techniques include chemical-mechanical polishing (CMP) or blanket plasma etch.

Such produces respective pedestal outer surfaces 58 which are substantially coplanar with planar insulating dielectric layer surfaces 29, with individual outer surfaces 58 constituting a substantially coplanar common outer surface with respect to the individual pillars and spacers. Such a construction and method further produces pedestal caps 60 of radially wider construction than longitudinal inner portions 53 of the contact pedestals, with such caps 60 having a substantially common longitudinal thickness "A".In the depicted and preferred embodiment, the distance between the respective contact bases and their associated node locations is shown to be constant at dimension "C".The thickness of insulating material over outermost conductive surfaces 25 of wordlines 17 and 18 to the contact opening bases is depicted with dimension "B". Most preferably, "A" and "B" are each greater than or equal to 0.1 micron.

FIG. 8 illustrates subsequent wafer processing, whereby capacitor constructions 87 and 88 are provided in electrical connection with pedestals 48 and 52, and a bit line 89 is provided in electrical connection with pedestal 50. An insulating layer 90 is provided outwardly of layer 30 and pedestals 48, 50 and 52. Capacitor container openings are provided through layer 90 to pedestals 48 and 52. Capacitor storage nodes 91 are provided therein. Layer 90 is etched to expose the outer lateral sidewalls of nodes 91. A cell dielectric layer 92 and a cell plate layer 93 are provided over the substrate. A subsequent insulating layer 94 is provided. A contact plug 95 is provided through layers 94 and 90 to pedestal 50. Bit line 89 is provided in electrical connection with plug 95 for DRAM circuitry fabrication.

Figure 9:
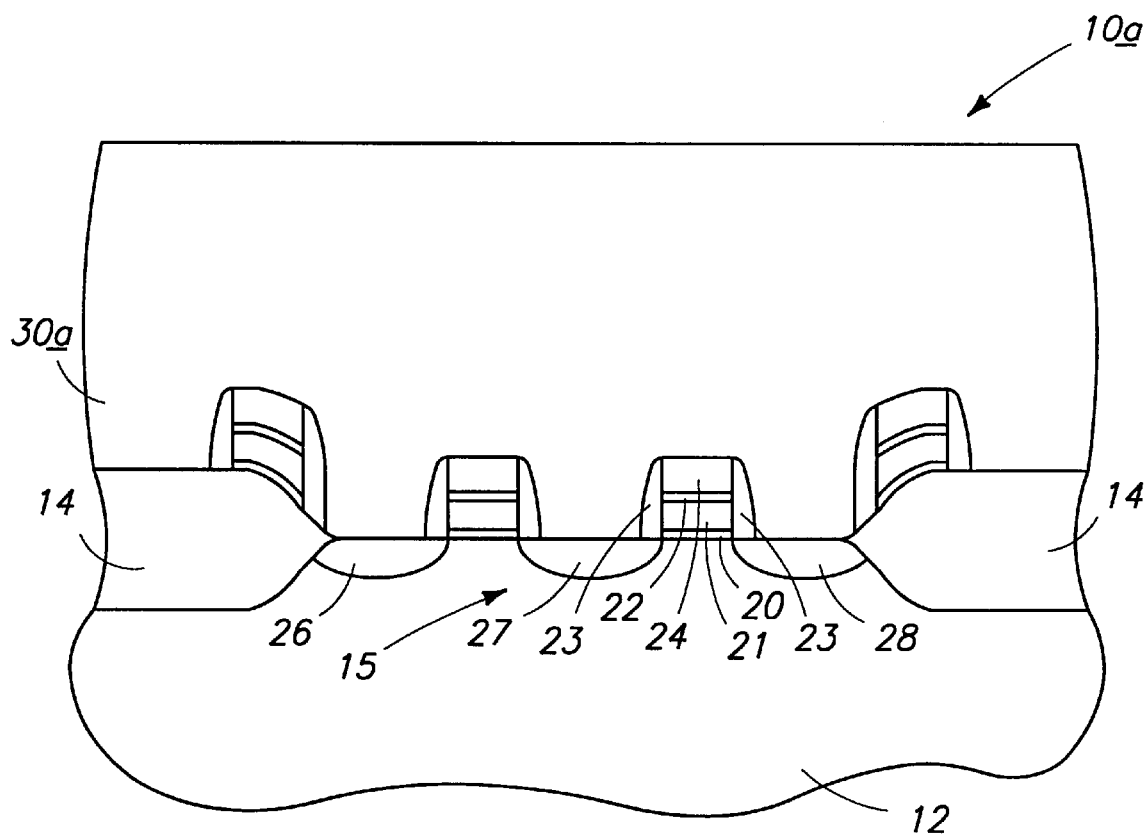
FIG. 9 is a diagrammatic sectional view of an alternate embodiment semiconductor wafer fragment at one alternate processing step in accordance with the invention.

An alternate embodiment is described with reference to FIGS. 9–13. Like numerals from the first described embodiment are utilized where appropriate, with differences being indicated by the suffix "a" or with different numerals. FIG. 9 depicts an alternate embodiment wafer fragment 10a which is essentially the same as that depicted by FIG. 1, but for elimination of hard mask layer 31 and increased thickness of layer 30a. An example thickness for layer 30a is from about 20,000 Angstroms to about 25,000 Angstroms.

Referring to FIG. 10, such is similar to FIG. 4 of the first described embodiment, with there being no associated masking layer 31. Further, contact openings 32a, 33a and 34a are provided deeper relative to insulating dielectric layer 30a, with the associated spacers 42a, 43a and 44a being substantially thicker. Such is represented by dimension "F". Further, the anisotropic etching to produce such spacers effectively outwardly exposes insulating dielectric material of layer 30 over the wordlines, wherein such was capped from such exposure by layer 31 in the first described embodiment.

Referring to FIG. 11, the step of collectively etching through the respective first, second and third contact opening bases of the first described embodiment also etches insulating dielectric material 30a over the illustrated wordlines, but to a degree insufficient to outwardly expose conductive surfaces 25 of such wordlines. Further, "D" is less than "F" preferably by from 0.1 micron to 0.3 micron. The illustrated dimension "E" from the contact opening base of the highest contact opening to its associated node location will be less than the dimension "D" etch of layer 30a above the wordlines. A more preferred, relationship is to have "D" greater than or equal to about 1.3E. Most preferred is for "D" to be equal to from about 1.3E to about 1.5E.

Referring to FIG. 12, an electrically conductive material layer 46a is once again deposited to fill the remaining first, second and third contact openings to the respective node locations.

Referring to FIG. 13, etching is conducted to produce the illustrated contact pedestals 48, 50 and 52.

FIG. 14 illustrates yet another modified embodiment. Like numerals from the first described embodiment are utilized where appropriate, with differences being indicated by the suffix "b" or with different numerals. FIG. 14 differs principally from the first described embodiment in that outer surface 29b of insulating dielectric layer 30b is initially provided to be unplanarized. Accordingly, masking layer 31b provided thereover is also unplanarized. With such example, a preferred deposited thickness for layer 30b is greater than or equal to 14,000 Angstroms. Processing of the FIG. 14 wafer fragment would then, occur as above, with an etching step being conducted to produce the desired electrically conductive contact pillars.

Yet another alternate embodiment is described with reference to FIGS. 15 and 16. Like numerals from the first described embodiment are utilized where appropriate, with differences being indicated by the suffix "c" or with different numerals. FIG. 15 is similar to the FIG. 14, depiction, but eliminates provision of the masking layer 31/31b and provides a thicker layer 30c. In such instance, the preferred deposited thickness of deposited layer 30c is greater than or equal to about 24,000 Angstroms.

Figure 16:
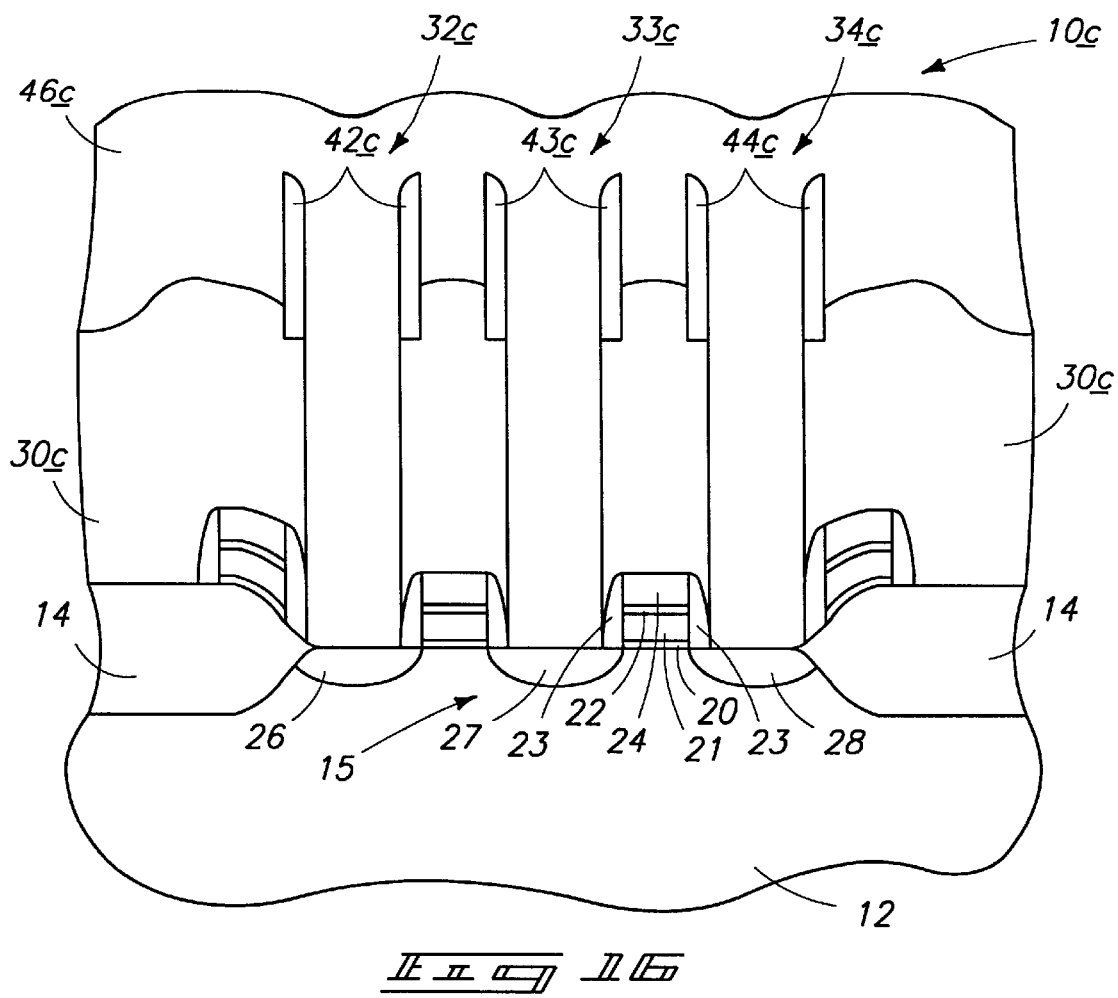
FIG. 16 is a view of the FIG. 15 wafer fragment at a processing step subsequent to that depicted by FIG. 15.

Referring to FIG. 16, the etch of BPSG layer 30c is conducted preferably as a timed etch down to approximately 2000 to 3000 Angstroms above conductive outer surfaces 25 of the wordlines. Most preferably, the thickness of nitride caps 24 in such embodiment where provided is equal to about 2,000 Angstroms. Subsequently, layer 46c is deposited. An etch would then be constructed to produce the same essential construction of FIG. 7.

Figure 17:
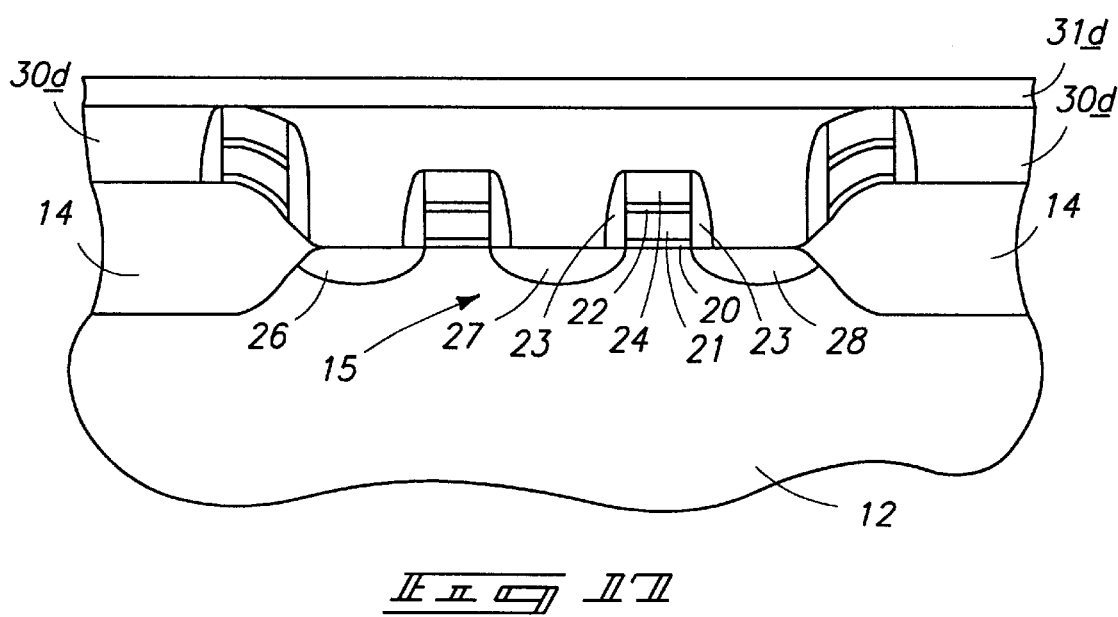
FIG. 17 is a diagrammatic sectional view of yet another alternate embodiment semiconductor wafer fragment at yet another alternate processing step in accordance with the invention.

Yet another alternate embodiment is described with reference to FIGS. 17 and 18. Like numerals from the first described embodiment are utilized where appropriate, with differences being indicated by the suffix "d" or with different numerals. FIG. 17 depicts an embodiment whereby insulating dielectric layer 30d is subjected to a planarizing etch, such as CMP, initially to stop atop the outer caps 24 of the outermost wordlines, with such effectively functioning as etch stop caps. Accordingly, such caps should be of a different material than layer 30d to facilitate or provide the desired planarizing etch stopping function. Insulating layer 31d is subsequently provided.

FIG. 18 illustrates subsequent processing in accordance with the above preferred embodiments, whereby conductive material is provided within the contact openings immediately prior to etching thereof, which will ultimately produce the desired conductive contact pedestals isolated from one another. Such etch can again be an anisotropic dry etch, an isotropic wet etch, or chemical-mechanical polishing.

Yet another alternate embodiment is described with reference to FIGS. 19–23. Like numerals from the first described embodiment are utilized where appropriate, with differences being indicated by the suffix "e" or with different numerals. In wafer fragment 10e, wordline 16e, 17e, 18e and 19e are provided without provision of any separate insulating material caps. Such caps could of course also be eliminated in the FIGS. 1–16 described embodiments, with the invention only being limited by the accompanying claims. Elimination of the caps facilitates reduction in topology to be planarized, and facilitates reduction of what would otherwise be required for the thickness insulating layer 30–30e. Such layer in this described embodiment is preferably deposited to a thickness of from about 25,000 Angstroms ito about 30,000 Angstroms. Contact openings 32e, 33e and 34e are etched as shown, with their depth penetration relative to insulating dielectric layer 30e preferably being between about 6,000 Angstroms and 12,000 Angstroms to provide a depth below the lowest topology of the outer portion of circuitry peripheral to the figure.

FIG. 20 shows wafer fragment 10e at the processing step substantially equivalent in sequence to that depicted by FIG. 6 in the first described embodiment.

Referring to FIG. 21, the electrically conductive pillar material within contact openings 32, 33, and 34, as well as their associated spacers and surrounding insulating material, is etched as shown. Such etching preferably uses an etch chemistry which etches all such materials at substantially the same rate to produce the illustrated capacitor container openings 70 and 72 over or relative to node locations 26 and 28. Such effectively provides conductive pillars 74 and 76 which project or extend respectively from the bases of contact openings 74 and 76 to the associated node locations 26 and 28, respectively. An example chemistry which will produce the illustrated anisotropic etch and etch polysilicon and BPSG at substantially the same rate would include $NF_3$, or a combination of $CF_4$ plus $CHF_3$. Alternately and by way of example only, polysilicon and BPSG can be etched sequentially using a first etch chemistry of $SF_6$ and $Cl_2$ followed by a second etch chemistry of $CF_4$, $CHF_3$ and Ar.

Figure 22:
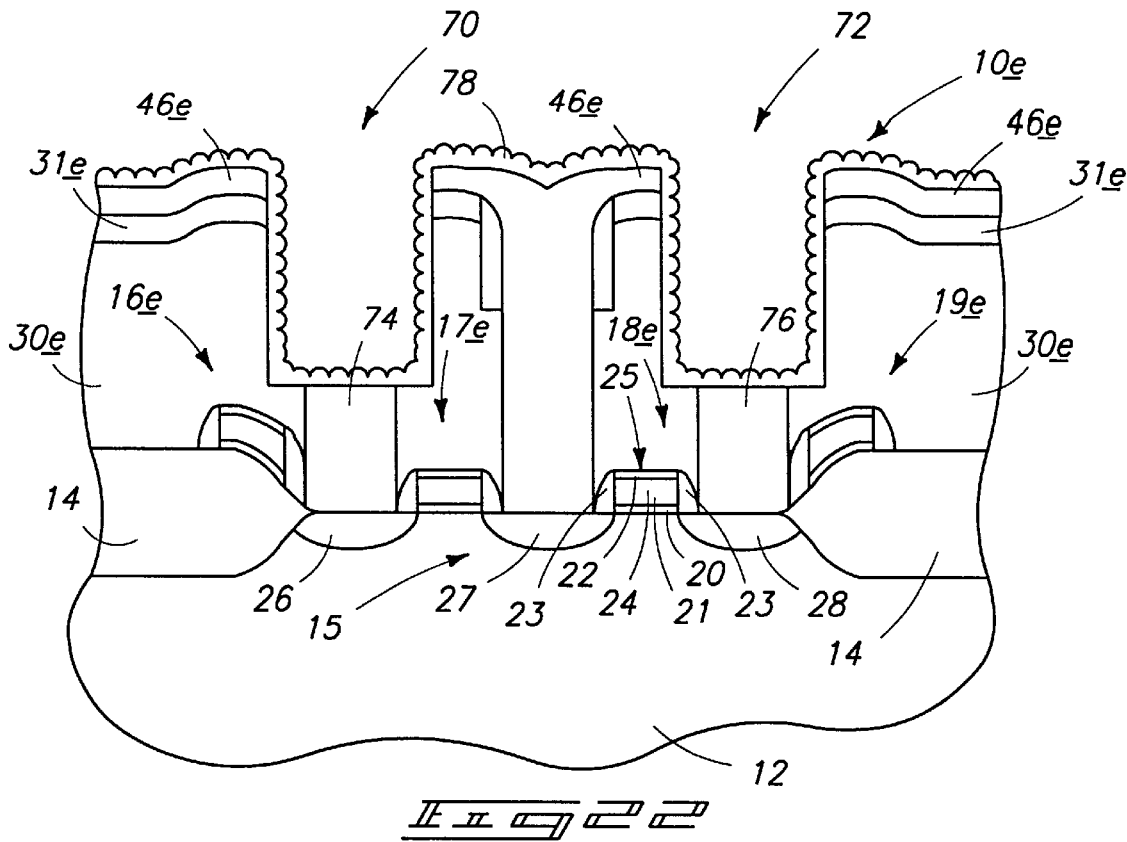
FIG. 22 is a view of the FIG. 19 wafer fragment at a processing step subsequent to that depicted by FIG. 21.

Referring to FIG. 22, a second layer 78 of electrically conductive material, preferably conductively doped polysilicon, is provided outwardly of etch stop layer 31e (and accordingly insulating dielectric layer 30e) and to within capacitor container openings 70 and 72 to a thickness which less than completely fills such openings.

Figure 23:
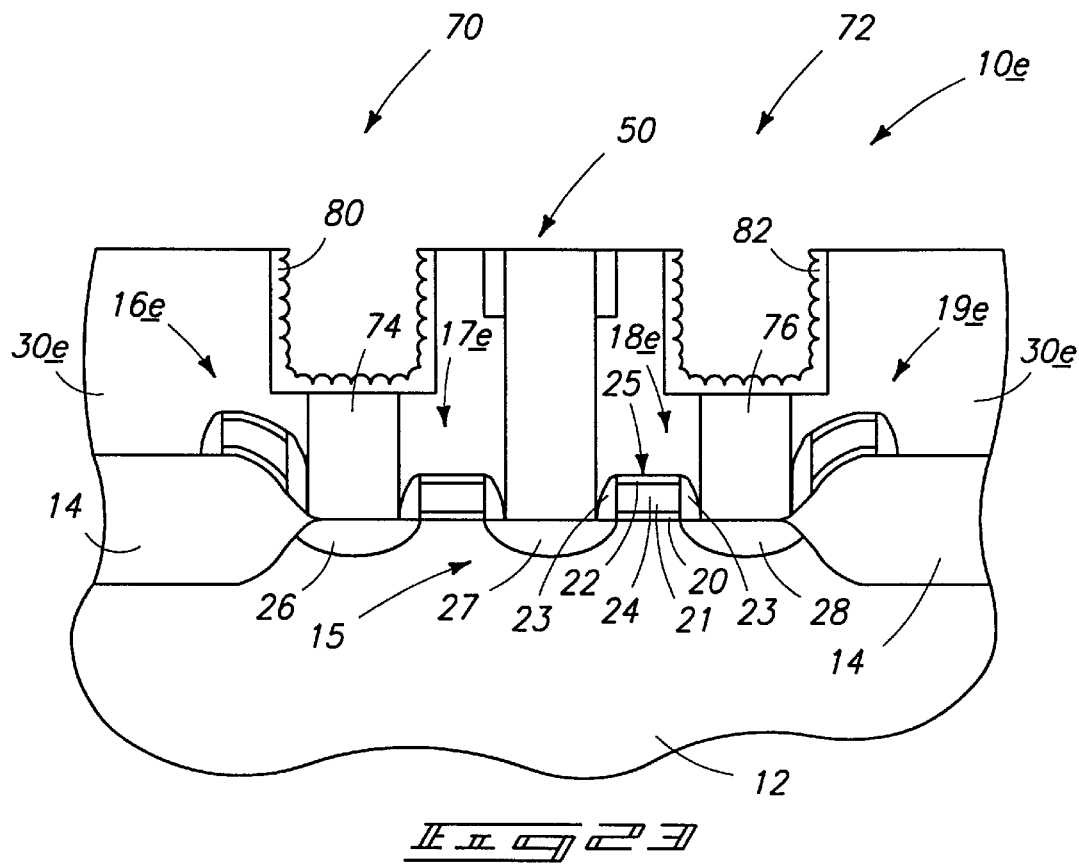
FIG. 23 is a view of the FIG. 19 wafer fragment at a processing step subsequent to that depicted by FIG. 22.

Then, referring to FIG. 23, etching is conducted relative to both second electrically conductive layer 78 and first electrically conductive layer 46e. This, effectively in the same step, defines contact pedestal 50 and an isolated capacitor storage node 80 within capacitor container opening 70 and an isolated capacitor storage node 82 with capacitor container opening 72. In accordance with preferred aspects of the invention, such can be utilized as a capacitor container storage node in fabrication of DRAM circuitry. The preferred etching by which the FIG. 23 construction is achieved is chemical-mechanical polishing.

The above described embodiments enable improvements in pedestal constructions over prior art constructions. For example with respect to my earlier U.S. Pat. No. 5,338,700 patent, the construction there disclosed if using 0.75 micron pitch technology would have an oval shaped base having a length of 0.5 microns and a width of 0.25 microns, and a substantially circular top of 0.5 micron diameter. This is in part due to the self-aligned contact etch which produces the illustrated plugs. Preferred pedestal constructions in accordance with the invention can have a pedestal base and a pedestal top which are both substantially circulars, with the top having a diameter of 0.5 micron and the base having a diameter of 0.25 micron for 0.75 micron pitch technology. A self-aligned contact etch is not required.

Figure 24:
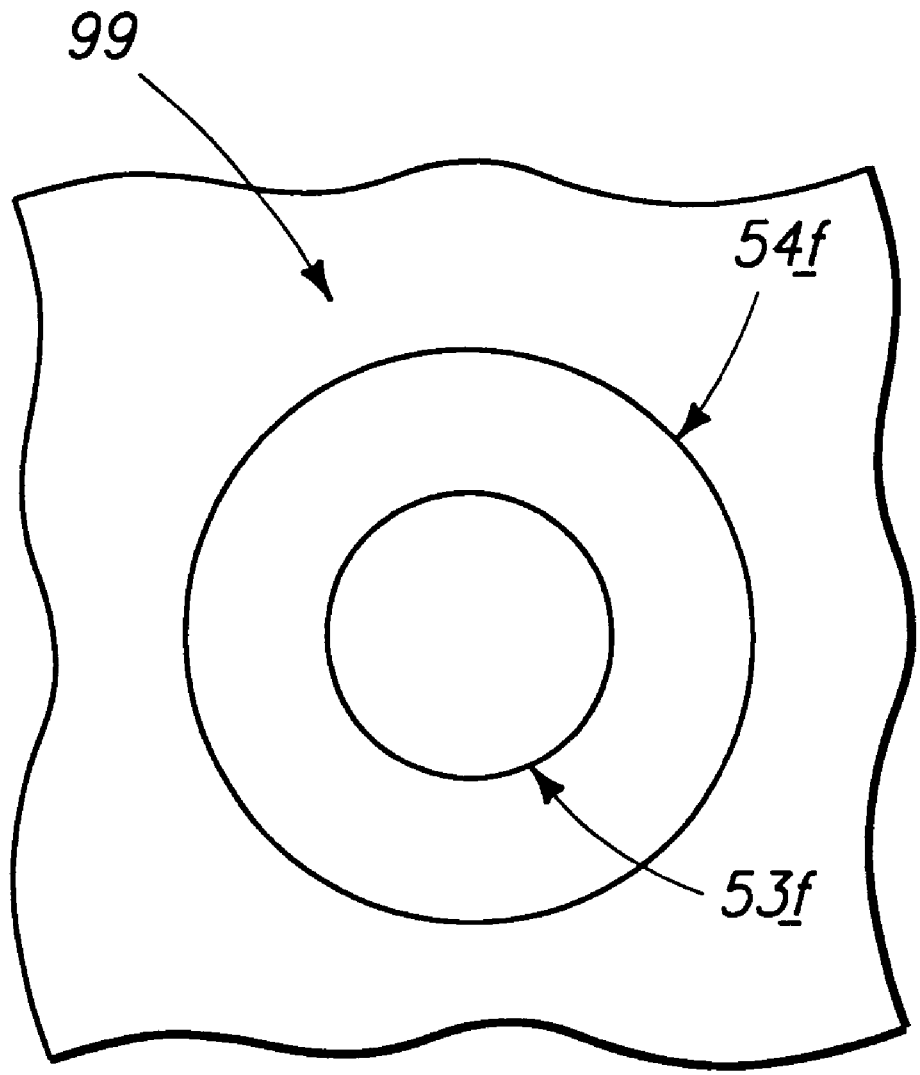
FIG. 24 is a diagrammatic top view of a contact pedestal in accordance with the invention.

For example, FIG. 24 depicts a diagrammatic top view of contact pedestal 99 having an outer longitudinal portion 54f and inner longitudinal portion 53f. As shown, both are substantially circular in radial cross section, with outer portion 54f being larger (twice as large) in radial cross section than inner portion 53f.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a conductive interconnect, comprising:

providing a semiconductive substrate within the substrate, providing a node location to which electrical connection is to be made;

providing insulating dielectric material over the node location and substrate;

etching an opening into the insulating dielectric material over the node location;

forming a sidewall spacer within the opening, the sidewall spacer not extending downwardly to contact the substrate;

filling the opening to the node location with a layer of electrically conductive material;

rendering the sidewall spacer electrically conductive;

the layer of electrically conductive material and sidewall spacer together defining a conductive interconnect to the node location; and after filling the opening with the electrically conductive material, etching the electrically conductive material to form an upper surface of the conductive material which is substantially coplanar with a laterally adjacent upper surface of the dielectric material.

2. The method of claim 1 wherein the substrate comprises silicon.

3. The method of claim 1 wherein the sidewall spacer comprises conductively-doped silicon.

4. The method of claim 1 wherein the sidewall spacer and electrically conductive material comprise conductively-doped silicon.

5. A semiconductor processing method of forming a conductive interconnect, comprising:

providing a node location to which electrical connection is to be made;

providing insulating dielectric material over the node location;

etching an opening into the insulating dielectric material over the node location to a degree insufficient to outwardly expose the node location, the opening having a base;

forming a sidewall spacer within the opening;

after forming the sidewall spacer, etching through the opening base to expose the node location;

filling the opening to the node location with a layer of electrically conductive material;

rendering the sidewall spacer electrically conductive;

the layer of electrically conductive material and sidewall spacer together defining a conductive interconnect to the node location; and after filling the opening with the electrically conductive material, etching the electrically conductive material to form an upper surface of the electrically conductive material which is substantially coplanar with a laterally adjacent upper surface of the dielectric material.

6. The method of claim 5 wherein the sidewall spacer comprises conductively-doped silicon.

7. The method of claim 5 wherein the sidewall spacer and electrically conductive material comprise conductively-doped silicon.

8. A semiconductor processing method of forming a conductive interconnect, comprising:

providing a node location to which electrical connection is to be made;

providing insulating dielectric material over the node location;

etching an opening into the insulating dielectric material over the node location to a degree insufficient to outwardly expose the node location, the opening having a base;

providing a spacer layer over the insulating dielectric material to within the opening to a thickness which less than completely fills the opening;

forming the spacer layer into a first sidewall spacer within the opening;

after forming the first sidewall spacer, etching through the opening base to expose the node location;

filling the opening to the node location with a first layer of electrically conductive material;

rendering the first sidewall spacer electrically conductive;

the first layer of electrically conductive material and first sidewall spacer together defining a conductive interconnect to the node location;

providing a second node location and a second contact opening into the insulating dielectric layer over the second node location, the second contact opening being insufficiently deep to outwardly expose the second node location, the second contact opening having a second base;

the spacer layer also being provided within the second contact opening; the spacer layer being anisotropically etched to form the first spacer and to form a second spacer within the second contact opening;

after forming the second sidewall spacer, etching through the second contact opening base to outwardly expose the second node location;

filling the second contact opening to the second node location with the electrically conductive material;

etching the insulating dielectric material and the conductive material filling the second contact opening to form a capacitor container opening over the second node location and a pillar of conductive material extending between the capacitor container opening and the second node location;

providing a second layer of electrically conductive material over the insulating dielectric layer and to within the capacitor container opening to a thickness which less than completely fills the capacitor container opening; and etching the second layer of conductive material to define an isolated capacitor storage node plate within the capacitor container opening.

9. The semiconductor processing method of claim 8 further comprising:

providing a capacitor container opening and a second layer of electrically conductive material over the insulating dielectric layer and to within the capacitor container opening to a thickness which less than completely fills the capacitor container opening; and etching the second layer of conductive material to define an isolated capacitor storage node plate within the capacitor container opening, the etching also etching the first layer of conductive material.

10. The semiconductor processing method of claim 8 wherein the etching to form the capacitor container contact opening is conducted to etch the insulating dielectric material and the conductive material filling the second contact opening at substantially the same rate.

11. A semiconductor processing method of forming a contact pedestal comprising the following steps:

providing a pair of wordlines having a node location therebetween to which electrical connection is to be made, the wordlines being over a silicon substrate;

providing insulating dielectric material over the pair of wordlines and the node location, the insulating dielectric material comprising BPSG;

etching a contact opening into the insulating dielectric material over the node location to a degree insufficient to outwardly expose the node location between the pair of wordlines, the contact opening having a base positioned elevationally outward of conductive portions of the pair of wordlines;

providing a polysilicon spacer layer over the insulating dielectric material to within the contact opening to a thickness which less than completely fills the contact opening;

anisotropically etching the spacer layer to form a sidewall spacer within the contact opening;

after forming the sidewall spacer, etching through the contact opening base to outwardly expose the node location between the pair of wordlines;

filling the contact opening to the node location with electrically conductive material;

rendering the sidewall spacer electrically conductive; and etching the electrically conductive material to form an electrically conductive contact pedestal comprising the sidewall spacer, the pedestal having an outer surface which is substantially coplanar with opposing laterally adjacent electrically insulative surfaces.

12. The semiconductor processing method of forming a contact pedestal of claim 11 wherein the spacer layer is provided to be electrically conductive prior to the anisotropic etching thereby rendering the spacer to be electrically conductive immediately upon its formation.

13. The semiconductor processing method of forming a contact pedestal of claim 11 wherein the spacer layer is not provided to be electrically conductive prior to the anisotropic etching, the spacer being rendered electrically conductive after the anisotropic etching.

14. The semiconductor processing method of forming a contact pedestal of claim 11 wherein the insulating dielectric material includes an outermost surface, the outermost surface being substantially unplanarized prior to the etching step to form the pedestal.

15. The semiconductor processing method of forming a contact pedestal of claim 11 further comprising providing wordlines with etch stop caps prior to providing said insulating dielectric material, the etch stop caps being of a different material than said dielectric material, the method further comprising planarize etching said dielectric material to the etch stop caps prior to etching the contact opening.

16. The semiconductor processing method of forming a contact pedestal of claim 11 wherein the insulating dielectric material comprises etch stop caps over wordlines, the method further comprising planarize etching dielectric material to the etch stop caps prior to etching the contact opening.

17. The semiconductor processing method of forming a contact pedestal of claim 11 wherein the insulating dielectric material includes an outermost surface, the outermost surface being substantially unplanarized prior to the etching step to form the pedestal, an unplanarized masking layer being provided over the unplanarized insulating dielectric material outermost surface prior to the etching step to form the pedestal.

18. The semiconductor processing method of forming a contact pedestal of claim 11 further comprising:

providing a capacitor container opening and a second layer of electrically conductive material over the insulating dielectric layer and to within the capacitor opening to a thickness which less than completely fills the capacitor container opening; and the etching step to form the pedestal also including etching the second layer of conductive material to define an isolated capacitor storage node plate within the capacitor container opening.

19. The semiconductor processing method of forming a contact pedestal of claim 11 further comprising:

providing a second node location and a second contact opening into the insulating dielectric layer over the second node location, the second contact opening being insufficiently deep to outwardly expose the second node location, the second contact opening having a second base;

the spacer layer also being provided within the second contact opening and the anisotropic etching thereof providing a second spacer within the second contact opening;

after forming the second sidewall spacer, etching through the second contact opening base to outwardly expose the second node location;

filling the second contact opening to the second node location with the electrically conductive material;

before the etching step to form the pedestal, etching the insulating dielectric material and the conductive material filling the second contact opening to form a capacitor container opening over the second node location and a pillar of conductive material extending between the capacitor container opening and the second node location;

providing a second layer of electrically conductive material over the insulating dielectric layer and to within the capacitor container opening to a thickness which less than completely fills the capacitor container opening; and the etching step to form the pedestal also including etching the second layer of conductive material to define an isolated capacitor storage node plate within the capacitor container opening.

20. The semiconductor processing method of forming a contact pedestal of claim 19 wherein the etching to form the capacitor container contact opening is conducted to etch the insulating dielectric material and the conductive material filling the second contact opening at substantially the same rate.

21. A semiconductor processing method of forming a contact pedestal comprising the following steps:

providing a pair of wordlines having a node location therebetween to which electrical connection is to be made, the wordlines being over a silicon substrate;

providing insulating dielectric material over the pair of wordlines and the node location;

etching a contact opening into the insulating dielectric material over the node location to a degree insufficient to outwardly expose the node location between the pair of wordlines, the contact opening having a base positioned elevationally outward of conductive portions of the pair of wordlines;

providing a silicon-containing spacer layer over the insulating dielectric material to within the contact opening to a thickness which less than completely fills the contact opening;

anisotropically etching the spacer layer to form a sidewall spacer within the contact opening and to outwardly expose the insulating dielectric material over the pair of wordlines;

after forming the sidewall spacer, etching through the contact opening base to outwardly expose the node location between the pair of wordlines, the step of etching through the contact opening base also etching insulating dielectric material over the pair of wordlines but to a degree insufficient to outwardly expose the pair of wordlines;

filling the contact opening to the node location with electrically conductive material;

rendering the sidewall spacer electrically conductive; and etching the electrically conductive material to form an electrically conductive contact pedestal comprising the sidewall spacer, the pedestal having an outer surface which is substantially coplanar with opposing laterally adjacent electrically insulative surfaces.

22. The semiconductor processing method of forming a contact pedestal of claim 21 wherein the spacer layer is provided to be electrically conductive prior to the anisotropic etching thereby rendering the spacer to be electrically conductive immediately upon its formation.

23. The semiconductor processing method of forming a contact pedestal of claim 21 wherein the spacer layer is not provided to be electrically conductive prior to the anisotropic etching, the spacer being rendered electrically conductive after the anisotropic etching.

24. The semiconductor processing method of forming a contact pedestal of claim 21 wherein the insulating dielectric material includes an outermost surface, the outermost surface being substantially unplanarized prior to the etching step to form the pedestal.

25. The semiconductor processing method of forming a contact pedestal of claim 21 wherein the quantity of insulating material etched over the pair of wordlines during the step of etching through the contact opening base is greater than or equal to at least about 1.3 times the distance between the contact base and the node location.

26. The semiconductor processing method of forming a contact pedestal of claim 21 wherein the quantity of insulating material etched over the pair of wordlines during the step of etching through the contact opening base is equal to from about 1.3 to 1.5 times the distance between the contact base and the node location.

27. A semiconductor processing method of forming a contact pedestal comprising the following steps:

provoking a conductive line having a node location adjacent thereto to which electrical connection is to be made, the conductive line being over a silicon substrate;

providing insulating dielectric material over the conductive line and the node location;

etching a contact opening into the insulating dielectric material over the node location to a degree insufficient to outwardly expose the node location the contact opening having a base positioned elevationally outward of the conductive line;

providing a silicon-containing spacer layer over the insulating dielectric material to within the contact opening to a thickness which less than completely fills the contact opening;

anisotropically etching the spacer layer to form a sidewall spacer within the contact opening and to outwardly expose the insulating dielectric material over the conductive line;

after forming the sidewall spacer, etching through the contact opening base to outwardly expose the node location the step of etching through the contact opening base also etching insulating dielectric material over the conductive line but to a degree insufficient to outwardly expose the conductive line;

filling the contact opening to the node location with electrically conductive material;

rendering the sidewall spacer electrically conductive; and etching the electrically conductive material to form an electrically conductive contact pedestal comprising the sidewall spacer, the pedestal having an outer surface which is substantially coplanar with opposing laterally adjacent electrically insulative surfaces.

28. The semiconductor processing method of forming a contact pedestal of claim 27 wherein the quantity of insulating material etched over the pair of wordlines during the step of etching through the contact opening base is greater than or equal to at least about 1.3 times the distance between the contact base and the node location.

29. The semiconductor processing method of forming a contact pedestal of claim 27 wherein the quantity of insulating material etched over the pair of wordlines during the step of etching through the contact opening base is equal to from about 1.3 to 1.5 times the distance between the contact base and the node location.

30. A semiconductor processing method of forming a plurality of contact pedestals comprising the following steps:

providing a pair of field oxide regions and an active area therebetween relative to a silicon substrate;

providing a pair of wordlines over the active area and first, second and third active area node locations adjacent thereto to which respective electrical connection is to be made;

providing insulating dielectric material over the pair of wordlines and over the first node location, the second node location and the third node location;

etching a first contact opening into the insulating dielectric material over the first node location, a second contact opening into the insulating dielectric material over the second node location and a third contact opening into the insulating dielectric material over the third node location; the first, second and third contact openings etching being conducted to a degree which is insufficient to outwardly expose any of the first, second and third node locations; the first contact opening having a first base, the second contact opening having a second base, the third contact opening having a third base; the first, second and third bases collectively being positioned elevationally outward of conductive portions of the pair of wordlines;

providing a silicon-containing spacer layer over the insulating dielectric material to within the first, second and third contact openings to a thickness which less than completely fills each of the first, second and third contact openings;

anisotropically etching the spacer layer to form a first sidewall spacer within the first contact opening, a second sidewall spacer within the second contact opening, and a third sidewall spacer within the third contact opening, and to outwardly expose insulating dielectric material over the pair of wordlines;

after forming the sidewall spacers, etching through the first, second and third contact opening bases to outwardly expose the first, second, and third node locations; the step of collectively etching through the first, second and third contact opening bases also etching insulating dielectric material over the pair of wordlines but to a degree insufficient to outwardly expose the pair of wordlines;

filling the first, second and third contact openings to the first, second and third node locations with electrically conductive material;

rendering the first, second and third sidewall spacers electrically conductive; and etching the electrically conductive material inwardly to insulating dielectric material to form first, second and third electrically conductive contact pedestals; the first pedestal comprising the first sidewall spacer, the second pedestal comprising the second sidewall spacer, the third pedestal comprising the third sidewall spacer; the first, second and third pedestals having respective outer surfaces which are substantially coplanar with one another and a planar outer surface of the insulating dielectric material.

31. The semiconductor processing method of forming a plurality of contact pedestals of claim 30 wherein the spacer layer is provided to be electrically conductive prior to the anisotropic etching thereby rendering the first, second and third spacers to be electrically conductive immediately upon their formation.

32. The semiconductor processing method of forming a plurality of contact pedestals of claim 30 wherein the spacer layer is not provided to be electrically conductive prior to the anisotropic etching; the first, second, and third spacers being rendered electrically conductive after the anisotropic etching.

33. The semiconductor processing method of forming a plurality of contact pedestals of claim 30 wherein the insulating dielectric material includes an outermost surface, the outermost surface being substantially unplanarized prior to the etching step to form the pedestal.

34. The semiconductor processing method of forming a plurality of contact pedestals of claim 30 wherein the quantity of insulating material etched over the pair of wordlines during the step of etching through the contact opening base is greater than or equal to at least about 1.3 times the greatest distance between one of, i) the first contact base and the first node location, ii) the second contact base and the second node location, and iii) the third contact base and the third node location.

35. The semiconductor processing method of forming a plurality of contact pedestals of claim 30 wherein the quantity of insulating material etched over the pair of wordlines during the step of etching through the contact opening base is equal to from about 1.3 to 1.5 times the greatest distance between one of, i) the first contact base and the first node location, ii) the second contact base and the second node location, and iii) the third contact base and the third node location.

* * * * *

UNITED STATES PATENT AND TRADEMARK OFFICE
CERTIFICATE OF CORRECTION

PATENT NO. : 6,312,984 B1
DATED : November 6, 2001
INVENTOR(S) : Charles H. Dennison It is certified that error appears in the above-identified patent and that said Letters Patent is hereby corrected as shown below:

Column 1,
Line 43, replace "region s in a" with -- region in a --
Line 58, replace "FIG. 1 a" with -- FIG.1 is a --
Line 38, replace "processing i step" with -- processing step --

Column 2,
Line 38, replace "to be a made" with -- to be made --

Column 4,
Line 45, replace "afi 34 include" with -- and 34 include --

Column 7,
Line 44, replace "Angstroms ito" with -- Angstroms to --

Column 8,
Line 31, "circulars, with" with -- circular, with --

Signed and Sealed this

Twenty-first Day of May, 2002

Attest:

Attesting Officer

JAMES E. ROGAN
Director of the United States Patent and Trademark Office